US012690163B2

(12) United States Patent
Lin et al.

(10) Patent No.: US 12,690,163 B2
(45) Date of Patent: Jul. 21, 2026

(54) AUTOMATIC LEVELING IMMERSION COOLING TANK AND METHOD OF OPERATING THE SAME

(71) Applicant: Taiwan Semiconductor Manufacturing Co., Ltd., Hsinchu (TW)

(72) Inventors: Wei-Sheng Lin, Hsinchu (TW); Chung-Chiu Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 181 days.

(21) Appl. No.: 18/439,614

(22) Filed: Feb. 12, 2024

(65) Prior Publication Data

US 2025/0261332 A1     Aug. 14, 2025

(51) Int. Cl.
*H05K 7/20* (2006.01)
*G01F 23/28* (2006.01)

(52) U.S. Cl.
CPC ......... *H05K 7/20236* (2013.01); *H05K 7/203* (2013.01); *H05K 7/20381* (2013.01); *G01F 23/28* (2013.01)

(58) Field of Classification Search
CPC ............... H05K 7/20236; H05K 7/203; H05K 7/20381; G01F 23/28
USPC ........................................................ 361/699
See application file for complete search history.

(56) References Cited

U.S. PATENT DOCUMENTS

| | | | |
|---|---|---|---|
| 9,351,429 B2 * | 5/2016 | Shelnutt ................. | H05K 7/203 |
| 2016/0143191 A1 * | 5/2016 | Smith ................ | H05K 7/20818 |
| | | | 361/679.46 |
| 2017/0127556 A1 * | 5/2017 | Smith .................... | H05K 5/067 |
| 2022/0361381 A1 * | 11/2022 | Sweeney ............ | H05K 7/20236 |
| 2023/0032562 A1 | 2/2023 | Sweeney et al. | |

FOREIGN PATENT DOCUMENTS

CN          105217413 A     1/2016

* cited by examiner

*Primary Examiner* — Zhengfu J Feng
(74) *Attorney, Agent, or Firm* — Seed IP Law Group

(57) ABSTRACT

A system including a coolant tank in which a coolant is stored. One or more electrical components that generate thermal energy when in operation are stored within the coolant tank and are immersed (e.g., partially submerged or fully submerged) within the coolant to mitigate the thermal energy generated when in operation. One or more sensors are configured to, in operation, monitor at least one of the following of a surface level of the coolant and a position of the coolant tank or monitor both such that the one or more electrical components remain properly immersed (e.g., partially submerged or fully submerged) within the coolant. One or more actuation structures, which may be active or passive in operation, are in mechanical cooperation with the coolant tank and are configured to, in operation, adjust the position of the coolant tank to maintain proper immersion of the one or more electrical components within the coolant.

20 Claims, 22 Drawing Sheets

410

| Collect data of at least one of the following of a surface level of a coolant within a coolant tank and a position of a coolant tank | ~412 |

| Process collected data | ~414 |

| Maintain or adjust a position of the coolant tank | ~416 |

700

Collect data of at least one of the following of a surface level of a coolant within a coolant tank and a position of a coolant tank   ~702

Process collected data   ~704

Monitor at least one of the following of a surface level of a coolant within a coolant tank and a position of the coolant tank   ~706

AUTOMATIC LEVELING IMMERSION COOLING TANK AND METHOD OF OPERATING THE SAME

BACKGROUND

Electronic components such as servers, GPUs, CPUs, or some other similar or like type of electronic components that generates heat when in use (e.g., running simulations or computations) are placed within a coolant tank and immersed or submerged within a coolant in a liquid state stored within the coolant tank. For example, when operation of the electronic components is initiated by a controller (e.g., a processor or microprocessor) such as to perform intensive simulations or computations, the electronic components generate heat that is dissipated by the coolant in the liquid state in which the electronic components are immersed or submerged. In some situations, as the coolant heats up (e.g., increases in temperature), the coolant in the liquid state is converted to a vapor or gaseous state (i.e., evaporation), which may be referred to as two phase immersion cooling. Alternatively, in some situations, when the coolant heats up (e.g., increase in temperature), the coolant heats up (e.g., increase in temperature), the hot coolant in the liquid state is removed before being converted into a vapor or gaseous state from the tank and new colder coolant is introduced, which may be referred to as single phase immersion cooling. Generally, the cooling tank is placed on the ground. However, if the ground is slightly unlevel such that the ground is not perfectly flat, portions of the electronic components are generally not fully immersed or fully submerged in the coolant when placed within the coolant tank. In other words, these portions of the electronic components may extend outward from a surface of the coolant in the liquid state stored within the coolant tank. Similarly, if there is an external disturbance such as an earthquake, the coolant tank may become unlevel resulting in portions of the electronic components no longer being fully immersed or fully submerged within the coolant stored within the coolant tank. When the electronic components are not fully immersed or fully submerged within the coolant when present within the coolant tank, the efficiency in maintaining an operating temperature of the electronic components is generally reduced. When the electronic components are not fully immersed or fully submerged due to the coolant being unlevel, the coolant being unlevel may also cause an imbalance of coolant flow through the coolant tank and between the electronic components causing and resulting in degraded thermal heat dissipation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
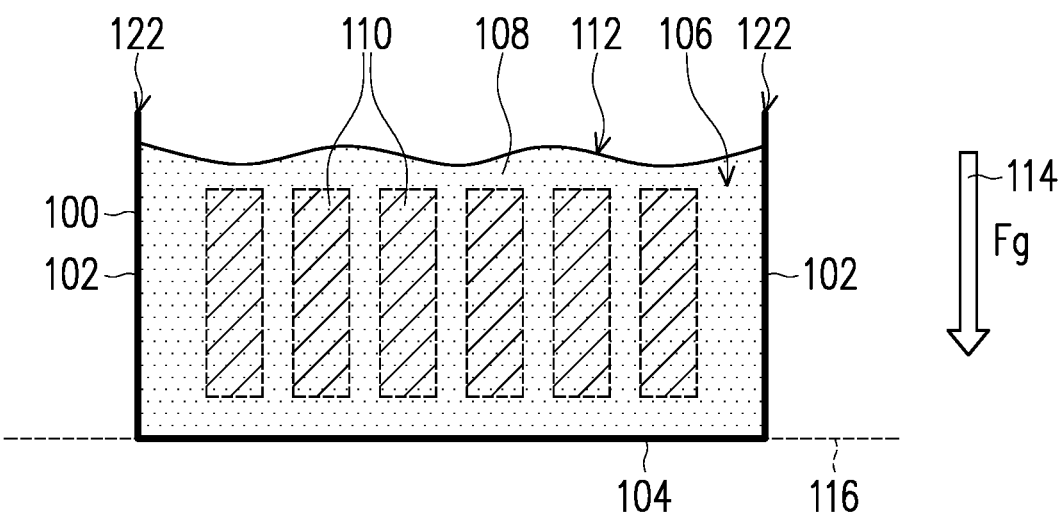
FIG. 1A is a cross-sectional side view of a coolant tank.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The use of "transverse" means that a surface, a sidewall, or similar or like structure or feature is at an angle, any angle, with respect to another respective surface, sidewall, or similar or like respective structure or feature. For example, if a first surface is transverse to a first sidewall, the first surface may be at an angle that is equal to 25-degrees, 35-degrees, 45-degrees, 75-degrees, 90-degrees, 120-degrees, and so forth to the first sidewall.

FIG. 1A is a cross-sectional side view of a coolant tank 100. The coolant tank 100 includes one or more sidewalls 102 and a bottom end 104, which is based on the orientation as shown in FIG. 1A. The bottom end 104 is transverse to the one or more sidewalls 102 and extends between the one or more sidewalls 102. For example, when the coolant tank 100 has a rectangular prism shape or profile, the one or more sidewalls 102 includes four sidewalls. Alternatively, when the coolant tank 100 has a cylindrical shape or profile, the one or more sidewalls 102 may only include a single sidewall. In other words, a number of the one or more sidewalls 102 will depend on the three-dimensional (3D) shape and profile of the coolant tank 100.

A cavity 106 of the coolant tank 100 is delimited by the one or more sidewalls 102 and the bottom end 104. A coolant 108 is stored within the cavity of the coolant tank 100. The coolant 108 may be a dielectric or non-conductive coolant that is in a liquid state. One or more electrical components or devices 110 are stored within the coolant tank 100 and are immersed within the coolant 108. As shown in FIG. 1A, the one or more electrical components 110 are fully submerged within the coolant 108 stored within the cavity 106 of the coolant tank 100 as the entirety of each respective electrical component 110 is below a surface level 112 of the coolant 108. The one or more electronic components 110 may be one or more servers, one or more GPUs, one or more CPUs, or one or more of some other suitable or like type of electronic component or combination of suitable or like type of electronic components that may be utilized to perform simulations or calculations. For example, when the one or more electronic components 110 are utilized to perform a complex simulation or calculation, the one or more electronic components 110 will generate thermal energy. The coolant 108 in the liquid state will dissipate this thermal energy generated by the one or more electronic components 110 as the coolant 108 is heated up by the thermal energy. When a two phase immersion process is utilized to dissipate thermal energy generated by the one or more electronic components 110, at least some of the coolant 108 in the liquid state may be converted from the liquid state to a vapor or gaseous state (not shown) due to the coolant 108 in the liquid state evaporating when exposed to this thermal energy generated by the one or more electrical components 110 immersed or submerged within the coolant 108. Alternatively, when a single phase immersion process is utilized to dissipate thermal energy generated by the one or more electronic components 110, the coolant 108 remains in the liquid state and is not converted to a vapor or gaseous state as the coolant 108 is removed from the coolant tank 100 and is replaced by new coolant through a flow coolant (see, e.g., FIG. 2 of the present disclosure).

A force of gravity ($F_g$) is represented by the arrow 114. The force of gravity 114 is the force that gravity applies to the coolant tank 100, the coolant 108, and the one or more electronic components 110.

As shown in FIG. 1A, the coolant 108 in the liquid state stored within the cavity 106 of the coolant tank 100 is substantially level relative to the coolant tank 100 such that the surface level 112 of the coolant 108 is substantially horizontal and flat. When the coolant tank 100 is properly level such that the surface level 112 of the coolant 108 is horizontal and flat, the surface level 112 is perpendicular or orthogonal (i.e., at ninety (90) degrees) relative to the one or more sidewalls 102 of the coolant tank 100. This relationship between the surface level 112 and the one or more sidewalls 102 will generally occur when a ground surface 116 on which the coolant tank 100 rests is substantially level and flat. In other words, in FIG. 1A, the bottom end 104 is substantially parallel with the ground surface 116 such that the angle between the bottom end 104 and the ground surface 116 is substantially equal to zero (0) degrees and the angle between the surface level 112 and respective internal surfaces of the one or more sidewalls 102 is substantially equal to ninety (90) degrees.

Figure 1B:
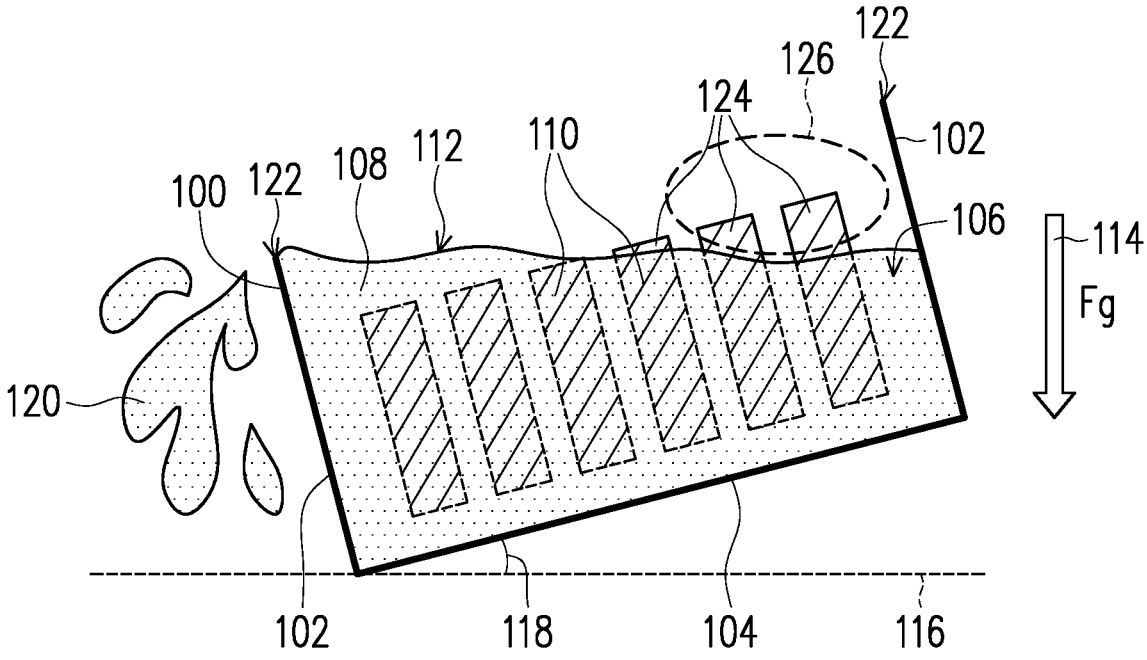
FIG. 1B is a cross-sectional view of the coolant tank as shown in FIG. 1A when tilted.

As shown in FIG. 1B, the coolant 108 in the liquid state stored within the cavity 106 of the coolant tank 100 is substantially unlevel relative to the coolant tank 100 such that while the surface level 112 may be substantially horizontal and flat, the surface level 112 is at an angle less than or greater than ninety (90) degrees relative to ones of the one or more sidewalls 102 of the coolant tank 100. An angle 118 between the ground surface 116 and the bottom end 104 of the coolant tank 100 is greater than zero (0) degrees. When the angle 118 becomes too large, a portion 120 of the coolant 108 in the liquid state spills out of the coolant tank 100 as the surface level 112 extends past respective ends 122 of the one or more sidewalls 102 of the coolant tank 100. In other words, as shown in FIG. 1B, the coolant tank 100 is tilted. However, in some instances when the angle 118 is relatively small such that the surface level 112 does not extend past the respective ends 122 of the one or more sidewalls 102 such that the coolant 108 does not spill out of the coolant tank 100, there may be an increased likelihood of spillage of the coolant 108 spilling out of the coolant tank 100 when exposed to external forces (e.g., an earthquake, an employee bumping into the coolant tank 100, or some other similar or like type of external force applied to the coolant tank 100).

When the coolant tank 100 is tilted as shown in FIG. 1B, respective portions 124 of respective electrical components of the one or more electrical components 110 extend outward from the surface level 112 of the coolant 108. For example, some of these respective portions 124 are encircled by the dotted circle 126 as shown in FIG. 1B.

Figure 1C:
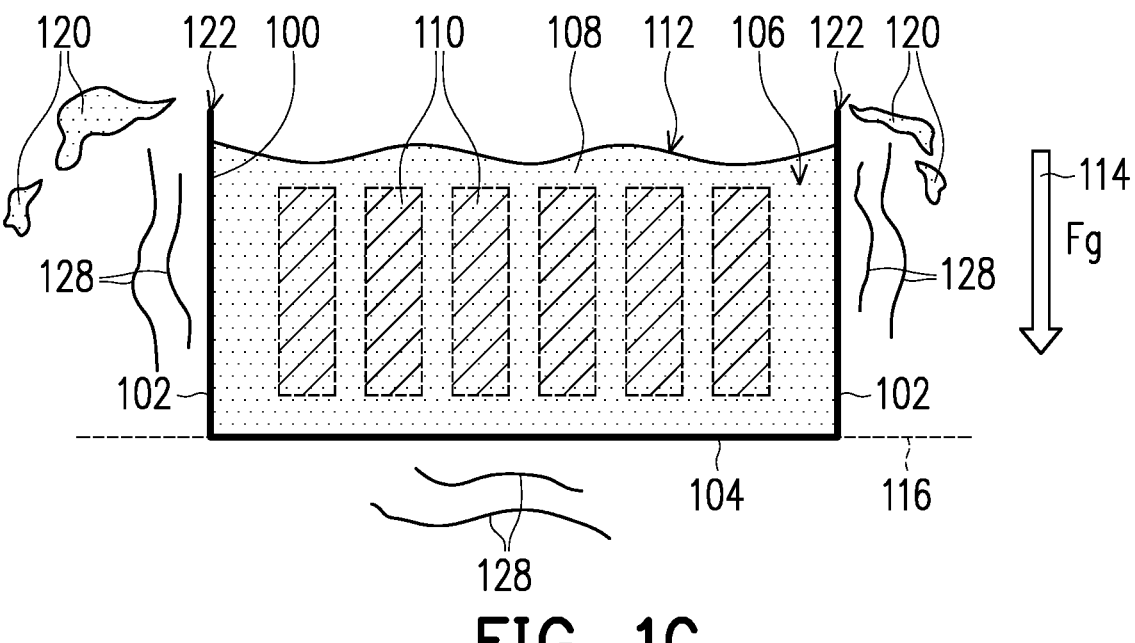
FIG. 1C is a cross-sectional view of a coolant tank as shown in FIG. 1A when exposed to external forces.

As shown in FIG. 1C, when the coolant tank 100 is exposed to external forces (e.g., an earthquake, an employee bumping into the coolant tank 100, or some other similar or like type of external force applied to the coolant tank 100) the portions 120 of the coolant 108 may spill out of the coolant tank 100. For example, the external force 128 may be vibration 128 due to an earthquake. When this vibration 128 becomes large enough such that the vibration 128 exceeds a vibration threshold, even if the coolant tank 100 is level as shown in FIG. 1A, the portions 120 of the coolant 108 may still spill out of the coolant tank 100. Similarly, if the coolant tank 100 is tilted as shown in FIG. 1B at the angle 118, the vibration threshold is decreased such that lower vibrations 128 will cause the portions 120 of the coolant 108 to spill from the coolant tank 100 as compared to when the coolant tank 100 is level as shown in FIG. 1A.

In view of the above discussions with respect to FIGS. 1A, 1B, and 1C, the present disclosure is directed to providing one or more embodiments of an automatic leveling immersion cooling tank system and one or more embodiments of a method of operating or controlling the one or more embodiments of the automatic leveling immersion cooling tank system to prevent or reduce the likelihood of the coolant 108 spilling out from a coolant tank and to prevent or reduce the likelihood of the coolant 108 from not covering the one or more electronic components.

The present disclosure is directed to providing one or more embodiments of an automatic leveling immersion cooling tank system that automatically levels itself such that a coolant (e.g., a dielectric coolant or non-conductive coolant) within the coolant tank properly immerses one or more electronic components within the coolant such that thermal energy generated by the one or more electronic components during operation is dissipated by the coolant. For example, in some instances, the proper immersion may be partial submersion of the one or more electronic components within the coolant, whereas, in other instances, the proper immersion may be fully and completely submerging the one or more electronic components within the coolant. In other words, the electronic components are properly immersed (e.g., partially or fully submerged) within the coolant automatically by the automatic leveling immersion cooling tank system to optimize efficiency and effectiveness in dissipating thermal energy generated by the one or more electronic components during operation. For example, the one or more electronic components may be servers, GPUs, CPUs, or some other suitable or like type of electronic component or combination of suitable or like type of electronic components that may be utilized to perform simulations or calculations. The present disclosure is further directed to a method of operating or controlling the automatic leveling immersion cooling tank such that the electronic components remain fully immersed or fully submerged within the coolant.

For example, at least one embodiment of an automatic leveling immersion cooling tank system of the present disclosure may be summarized as including a coolant tank including a cavity in which a coolant is stored. The coolant tank being configured to, in operation, receive one or more electrical components to immerse the one or more electrical components within the coolant. One or more sensors configured to, in operation, monitor at least one of the following of a surface level of the coolant and a position of the coolant tank. One or more actuation structures in mechanical corporation with the coolant tank, the one or more actuation structure being configured to, in operation, adjust the position of the coolant tank.

For example, at least one embodiment of a method of operating or controlling the automatic leveling immersion cooling tank system of the present disclosure may be summarized as including detecting at least one of the following of a surface level of a coolant stored within a coolant tank and a position of the coolant tank with one or more sensors. Processing one or more sensor signals output by the one or more sensors with a microprocessor to determine a direction of a zenith of gravity relative to the coolant tank. Outputting a control signal from the microprocessor based on the direction zenith of gravity relative to the coolant tank to adjust the position of the coolant tank with one or more actuation structures. Adjusting the position of the coolant tank in which the coolant is stored with the one or more actuation structures.

Figure 2:
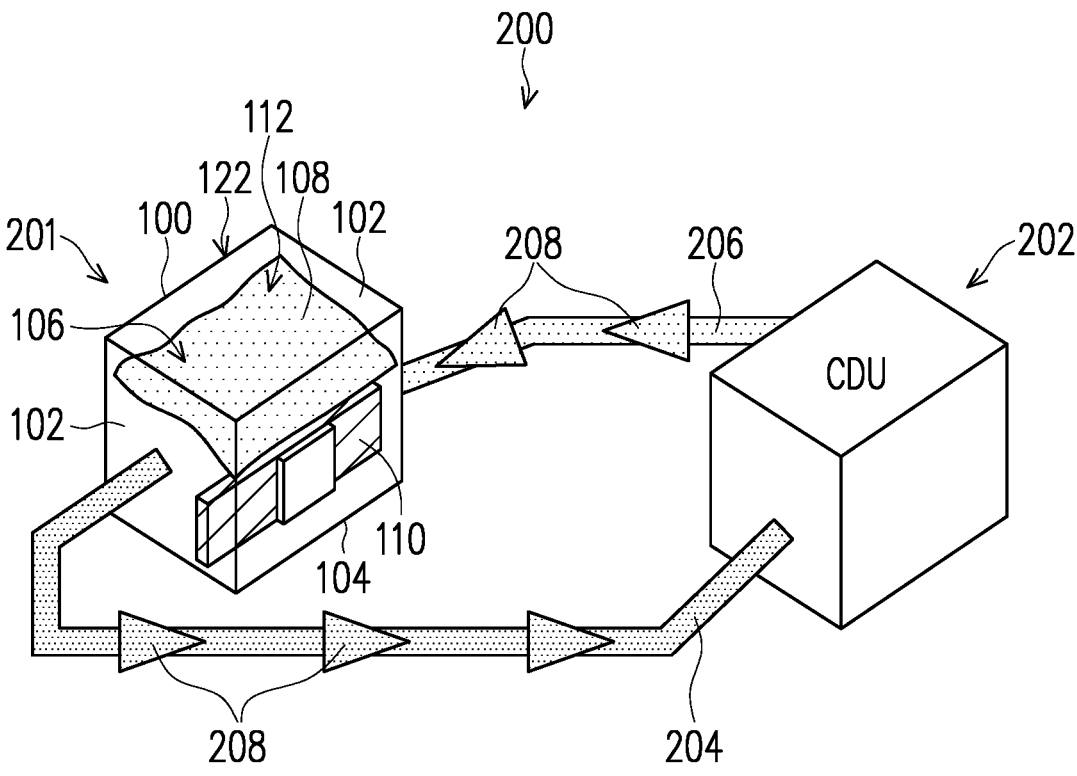
FIG. 2 is a perspective view of a cooling system, in accordance with some embodiments.

FIG. 2 is a perspective view of a cooling system 200, in accordance with some embodiments. The same or similar features present within the cooling system 200 will be provided with the same or similar reference numerals as the same or similar features of those as discussed earlier herein with respect to FIGS. 1A-1C. The details of these same or similar features will not be reproduced fully herein for the sake of simplicity and brevity of the present disclosure.

The cooling system 200 includes an automatic leveling immersion cooling tank system 201 and a coolant distribution unit (CDU) 202. The automatic leveling immersion cooling tank system 201 includes the coolant tank 100 that is in fluid communication with the CDU 202 through a first coolant line 204 and a second coolant line 206. The first coolant line 204 may be a respective coolant line for the coolant 108 that is hot, which may be in a liquid state, a vapor or gaseous state, or both, that is transferred from the coolant tank 100 to the CDU 202, and the second coolant line 206 may be a respective coolant line for the coolant 108 that is cold, which may be in a liquid state, that is transferred from the CDU 202 back to the coolant tank 100. In other words, the coolant tank 100, the CDU 202, the first coolant line 204, and the second coolant line 206 form a cyclic system of which the coolant 108 may be cycled through when dissipating heat generated by the one or more electronic components 110 present within the coolant tank 100.

A flow of the coolant 108 through the first and second coolant lines 204, 206 is represented by arrows 208. In view of this flow represented by the arrows 208, the first coolant line 204 functions as a coolant outlet for the coolant tank 100 and a coolant inlet for the CDU 202, and the second coolant line functions as a coolant outlet for the CDU 202 and a coolant inlet for the coolant tank 100.

The CDU 202 is configured to, in operation, receive the coolant 108 that is in a hot state (i.e., a first temperature) after dissipating heat from the one or more electrical components 110 when in operation through the first coolant line 204. The CDU 202 receives the coolant 108 in the hot state and cools the coolant 108 back to a cold state (i.e., a second temperature less than the first temperature). The coolant 108 in the cold state is reintroduced back to the coolant tank 100 of the automatic leveling immersion cooling tank system 201 through the second coolant line 206. In some embodiments, the CDU 202 may include a cooling device or structure (not shown) to cool the coolant 108 from the hot state (i.e., the first temperature) to the cold state (i.e., the second temperature less than the first temperature). In some embodiments, the CDU 202 may include a filter through which the coolant 108 passes to remove any particular or debris that may be present within the coolant 108. This process is performed cyclically as the one or more electrical components 110 are in operation when performing a simulation or calculation and generating thermal energy that is dissipated by the coolant 108 in the liquid state present within the cooling tank 100 of the automatic leveling immersion cooling tank system 201.

While not shown in FIG. 2, the coolant tank 100 may be in mechanical cooperation with one or more actuation components, structures or devices (see, e.g., FIGS. 11, 13, and 15 of the present disclosure), which will be discussed in detail later herein. While not shown in FIG. 2, one or more sensors (see, e.g., FIGS. 3, 4A, 4B, 5, 6, 7, 8A, 8B, 9A, 9B, and 10 of the present disclosure), which may include different combinations of different types of sensors, monitor characteristics of the coolant 108 such as the surface level, a position of the coolant tank 100, or some other type of characteristic that may be utilized in automatically leveling the coolant tank 100, which will be discussed in detail later herein.

When the cooling system 200 is utilized to perform a two-phase immersion cooling process, the coolant 108 is converted from a liquid state to a vapor or gaseous state. Once the coolant 108 is in the vapor or gaseous state, the coolant in the vapor or gaseous state passes through the first coolant line 204 to the CDU 202. Once the coolant 108 in the vapor or gaseous state reached the CDU 202, the CDU 202 cools the coolant 108 back down such that the coolant 108 is converted back to the liquid state. The coolant 108, which is now back in the liquid state, passes through the second coolant line 206 back to the coolant tank 100. This two-phase immersion cooling process is continually performed to dissipate thermal energy generated by the electronic components 110 submerged or immersed within the coolant 108.

Alternatively, when the cooling system 200 is utilized to perform a one-phase or single-phase cooling process, the coolant 108 is not converted from a liquid state to a vapor or gaseous state, and, instead, the coolant 108 simply remains in the liquid state for the entire process. For example, once some of the coolant 108 in the liquid state heats up from the thermal energy generated by the one or more electronic components 110, the hot coolant 108 passes through the first line 204 to the CDU 202. Once the coolant 108, which is hot and in the liquid state, reaches the CDU 202, the CDU 202 cools the coolant 108, which remains in the liquid state. Once the coolant 108 is cold, the coolant 108, which is still in the liquid state, passes through the second line 206 back to the coolant tank 100. This single-phase immersion cooling process is continually performed to dissipate thermal energy generated by the electronic components 110 submerged or immersed within the coolant 108.

In view of the above discussion with respect to the flow of the coolant 108 through the cooling system 200, when the surface level 112 of the coolant 108 within the coolant tank 102 is unlevel, a flow of coolant 108 through the coolant tank 102 may not be optimized when passing by the one or more electronic components 110 reducing an overall efficiency of the coolant 108 to dissipate thermal energy generated by the one or more electronic devices 110. In view of this, if the surface level 112 of the coolant 108 is maintained in a level state even in the event of external disturbances, the flow of the coolant 108 through the coolant tank 102 and the cooling system 200 will be optimized increasing an overall efficiency of the coolant 108 to dissipate thermal energy generated by the one or more electronic components 110.

This increase in efficiency by maintaining the surface level 112 of the coolant 108 within the coolant tank 102 may readily apply to both when the two-phase immersion cooling process or the single-phase immersion cooling process is being carried out by utilizing the cooling system 200.

Figure 3:
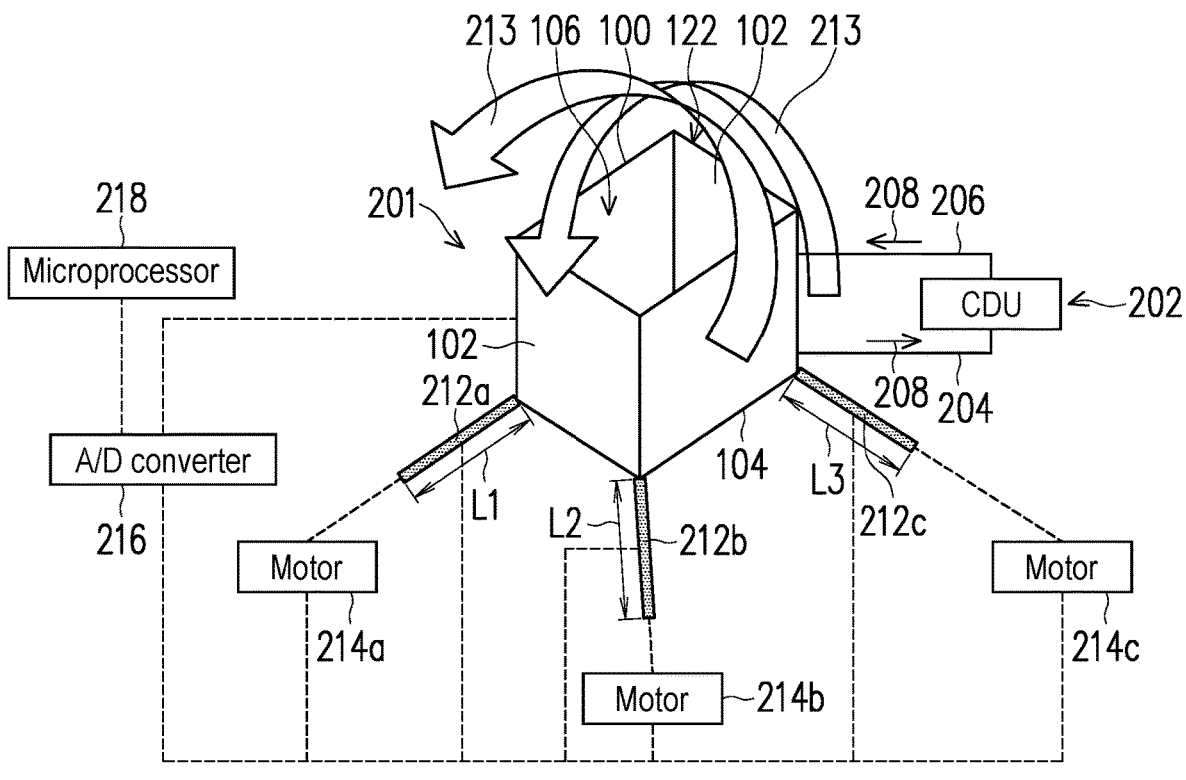
FIG. 3 is a perspective view of an automatic leveling immersion cooling tank system of the cooling system as shown in FIG. 2, in accordance with some embodiments.

FIG. 3 is a perspective view of the automatic leveling immersion cooling tank system 201 of the cooling system 200 as shown in FIG. 2, in accordance with some embodiments. Additional details of the automatic leveling immersion cooling tank system 201 are shown in FIG. 3 relative to those features as shown in FIG. 2. As shown in FIG. 3, the automatic leveling immersion cooling tank system 201 includes one or more actuators 212a, 212b, 212c that are configured to, in operation, actuate to adjust a position of the coolant tank 100 to level the coolant tank 100 such that the surface level 112 of the coolant 108 within the coolant tank 100 is substantially level (e.g., the surface level 112 being perpendicular or orthogonal to the one or more sidewalls 102 of the coolant tank 100 and parallel with the bottom end 104 of the coolant tank 100). As shown in FIG. 3, the one or more actuators 212a, 212b, 212c work together with the one or more motors 214a, 214b, 214c to rotate, move, and adjust the position of the coolant tank 100 as represented by arrows 213.

In this embodiment of the automatic leveling immersion cooling tank system 201 as shown in FIG. 3, the one or more actuators 212a, 212b, 212c are pistons that may be adjusted in length to adjust the position of the coolant tank 100. In some alternative embodiments, the actuators 212 may be some other type of actuator that is suitable for adjusting the position of the coolant tank 100. In some embodiments, the one or more actuators 212a, 212b, 212c may be some other similar or like type of linear actuator. In some embodiments, the one or more actuators 212a, 212b, 212c are robotic arms. In some embodiments, the one or more actuators 212a, 212b, 212c may be replaced by some other combination or types of actuators (e.g., rotational actuators, hydraulic actuators, magnetic actuators, rotary actuators, or any other suitable type of actuator) that are configured to, in operation, rotate, move, or reposition the coolant tank 100 such that the surface level 112 of the coolant 108 is level. For the following discussion herein, the one or more actuators 212a, 212b, 212c will be discussed as though the one or more actuators 212a, 212b, 212c are linear actuators.

One or more motors 214a, 214b, 214c are in mechanical cooperation with the one or more actuators 212. The one or more motors 214a, 214b, 214c provide power such that respective lengths L1, L2, L3 of the one or more actuators 212a, 212b, 212c may be adjusted to adjust the position of the coolant tank 100.

In this embodiment of the automatic leveling immersion cooling tank system 201 as shown in FIG. 3, the one or more actuators 212a, 212b, 212c include a first actuator 212a, a second actuator 212b, and a third actuator 212c, and the one or more motors 214a, 214b, 214c include a first motor 214a, a second motor 214b, and a third motor 214c. The first motor 214a is in mechanical cooperation with the first actuator 212a, the second motor 214b is in mechanical cooperation with the second actuator 212b, and the third motor 214c is in mechanical cooperation with the third actuator 212c. While there are three motors and three actuators in this embodiment of the automatic leveling immersion cooling tank system 201, it will be readily appreciated that in alternative embodiments of the automatic immersion cooling tank system 201 there may be only one motor and only one actuator, there may be two motors and two actuators, or there may be any combination of any number of actuators and any number of motors for adjusting the position of the coolant tank 100. In other words, any number of actuators or any number of motors may be utilized to move, rotate, or reposition the coolant tank 100 to maintain the surface level 112 of the coolant 108 at a level state within the coolant tank 102.

When powered on, the first motor 214a adjusts a first length L1 of the first actuator 212a. When powered on, the second motor 214b adjusts a second length L2 of the second actuator 212b. When powered on, the third motor 214c adjusts a third length L3 of the third actuator 212c. The first, second, and third motors 214a, 214b, 214c may be controlled to adjust the first length L1, the second length L2, and the third length L3 by differing amounts to adjust the position of the coolant tank 100.

The one or more motors 214a, 214b, 214c and the one or more actuators 212a, 212b, 212c are in electrical communication with an analog to digital (A/D) converter 216. The A/D converter 216 converts analog signals to digital signals that are then provided to a microprocessor 218. The microprocessor 218 is in electrical communication with the A/D converter 216. The microprocessor 218 may then process the digital signals based on the analog signals output by the one or more motors 214a, 214b, 214c to determine whether to provide power to the one or more motors 214a, 214b, 214c or activate selected ones of the one or more motors 214a, 214b, 214c. For example, an external power source (not shown) may be coupled to the one or more motors 214a, 214b, 214c that provides power to the one or more motors 214a, 214b, 214c, and the microprocessor may output control signals such that the external power source only provides power to individual ones of the one or motors 214a, 214b, 214c to adjust the respective lengths L1, L2, L3 of the actuators 212a, 212b, 212c to adjust the position of the coolant tank 100.

While not shown in FIG. 3, the one or more actuators 212a, 212b, 212c may include one or more actuator sensors that are configured to, in operation, monitor characteristics such as the respective lengths L1, L2, L3 of the one or more actuators 212a, 212b, 212c. These one or more actuator sensors are in electrical communication with the A/D converter 216 such that the A/D converter can convert the analog signals to the digital signals that are then provided to the microprocessor 218. The microprocessor 218 then processes the digital signals based on the analog signals output by the one or more actuator sensors to determine the respective lengths L1, L2, L3 of the one or more actuators 212a, 212b, 212c, which may be utilized in determining whether to adjust the position of the coolant tank 100. While not shown in FIG. 3, one or more sensors (see, e.g., FIGS. 4, 5A, 5B, 6, 7, 8, 9A, 9B, 10A, 10B, and 11) monitoring various characteristics of the coolant tank 100 (e.g., the surface level 112 of the coolant 108 within the coolant tank 100, the position of the coolant tank 100, or some other characteristic with respect to the coolant tank 100) are in electrical communication with the A/D converter 216. Various options and combinations of options for these one or more sensors will become readily apparent in view of the following discussions herein with respect to FIGS. 4, 5A, 5B, 6, 7, 8, 9A, 9B, 10A, 10B, and 11 of the present disclosure.

While in the embodiment as shown in FIG. 3, the A/D converter 216 is provided between the various sensors and the microprocessor 218, in some alternative embodiments, the A/D converter 216 may be part of the microprocessor

218 itself or the microprocessor 218 may be able to directly receive the analog signals such that the A/D converter 216 is not present.

The A/D converter 216 may be in wired or wireless connection with the one or more actuators sensors of the one or more actuators 212a, 212b, 212c, with the one or more motors 214a, 214b, 214c, and the one or more sensors that monitor characteristics relative to the coolant tank 100.

The microprocessor 218 may monitor the various characteristics of the one or more actuators 212a, 212b, 212c, of the one or more motors 214a, 214b, 214c, and with respect to the coolant tank 100 to control the position of the coolant tank 100 to prevent or reduce the likelihood of the coolant 108 spilling out of the coolant tank 100. For example, when the coolant tank 100 is unlevel due to the ground surface 116 being unlevel, the microprocessor 218 may determine that the position of the coolant tank 100 is to be adjusted to prevent or reduce the likelihood of the coolant 108 spilling out the coolant tank 100 or to maintain proper immersion or submersion of the one or more electronic components 110 within the coolant 108. The microprocessor 218 performs this determination in real time such that the coolant tank 100 remains level resulting in the surface level 112 of the coolant 108 remaining level within the coolant tank 100.

The microprocessor 218 may monitor the various characteristics of the one or more actuators 212a, 212b, 212c, of the one or more motors 214a, 214b, 214c, and with respect to the coolant tank 100 to control the position of the coolant tank 100 to improve immersion of the one or more electronic components 110 present within the coolant tank 100. For example, when the coolant tank 100 is exposed to external forces (e.g., an earthquake, an employee bumping into the coolant tank 100, or some other similar or like type of external force applied to the coolant tank 100) generating the vibration 128, the microprocessor 218 may determine that the position of the coolant tank 100 is to be adjusted to prevent or reduce the likelihood of the coolant 108 spilling out the coolant tank 100 or to maintain proper immersion or submersion of the one or more electronic components 110 within the coolant 108. The microprocessor 218 performs this determination in real time such that the coolant tank 100 remains level resulting in the surface level 112 of the coolant 108 remaining level within the coolant tank 100.

This real time monitoring by the microprocessor 218 preventing or reducing the likelihood of spilling of the coolant 108 from the coolant tank 100 prevents or reduces the likelihood of generating a dangerous work environment within a semiconductor manufacturing plant (FAB). This real time monitoring by the microprocessor 218 preventing or reducing the likelihood of spilling of the coolant 108 from the coolant tank 100 reduces operating costs as the coolant 108 is not wasted due to being spilled out of the coolant tank 100 resulting in the introduction of new coolant into the cooling system 200 to maintain proper heat dissipation efficiency.

Maintaining proper immersion or submersion of the one or more electronic components 110 within the coolant 108 maintains or increases an efficiency of the cooling system 200 to dissipate thermal energy or heat generated by the one or more electronic components 110 when in operation. Maintaining optimized efficiency of the cooling system 200 in dissipating thermal energy or heat generated by the one or more electronic components 110 reduces operating costs as less overall energy or power is needed to operate the cooling system 200.

In other words, in view of the above discussion, the automatic leveling immersion cooling tank system 201 prevents or reduces the likelihood of the issues as discussed with respect to FIGS. 1A and 1B as discussed in detail earlier herein.

Figure 4:
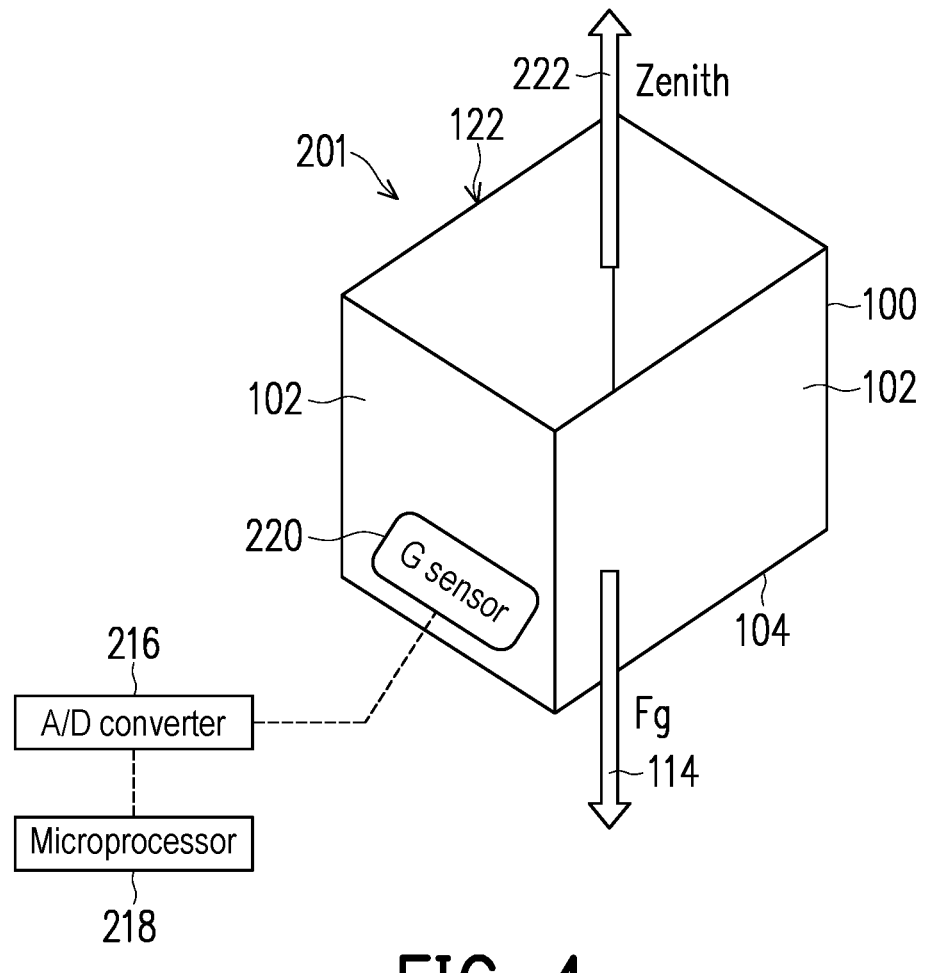
FIG. 4 is a perspective view of a coolant tank, in accordance with some embodiments.

FIG. 4 is a perspective view of the coolant tank 100 of the automatic leveling immersion cooling tank system 201, in accordance with some embodiments. As shown in FIG. 4, a g-sensor 220 (gravity sensor) is mounted to a respective sidewall of the one or more sidewalls 102 of the coolant tank 100. In some embodiments, the g-sensor 220 may be mounted to a different respective sidewall 102 of the coolant tank 100, may be mounted to the bottom end 104 of the coolant tank 100, or may be mounted to a lid (see, e.g., FIGS. 9A, 9B, 10A, and 10B of the present disclosure) that is coupled to the coolant tank 100 to close off the cavity 106 from an external environment. The g-sensor 220 is config-ured to, in operation, measure the gravity 114 and the direction of gravity 114 relative to the coolant tank 100.

The g-sensor 220 is in electrical communication with the A/D converter 216. The g-sensor 220 may be in wired communication or may be in wireless communication with the A/D converter 216. In some embodiments, the g-sensor 220 may be in electrical communication with the micropro-cessor 218 directly when the A/D converter 216 is part of the microprocessor 218 or is not present as the microprocessor 218 can process the analog signals output by the g-sensor 220.

The g-sensor 220 outputs electrical signals representative of the measurement of gravity 114 and the direction of gravity 114 relative to the coolant tank 100. The micropro-cessor 218 then utilizes these electrical signals, which passed through the A/D converter 216, to determine a zenith 222 that is in a direction opposite to the direction of gravity 114, which is represented by the arrow 114 as discussed earlier herein. For example, once the zenith 222 is deter-mined, the microprocessor may utilize the zenith either alone or along with other information collected and pro-cessed by the microprocessor 218 (e.g., the lengths L1, L2, L3 of the one or more actuators 212a, 212b, 212c, the surface level of the coolant 108 within the coolant tank 100, the position of the coolant tank 100, or other similar or like type of information with respect to the automatic leveling immersion cooling tank system 201), the microprocessor 218 outputs one or more control signals that results in respective motors of the one or more motors 214a, 214b, 214c providing power to respective actuators of the one or more actuators 212a, 212b, 212c. The microprocessor 218 makes various determinations and outputs various control signals in real time to automatically adjust the one or more actuators 212a, 212b, 212c based on the zenith 222 to prevent or reduce the likelihood of spilling and improve the efficiency of the cooling system 200 to cool and maintain the temperatures of the one or more electronic components 110 immersed (e.g., partially submerged or fully submerged) within the coolant 108. The microprocessor 218 may per-form this process in real time. In some embodiments, the microprocessor 218 continuously performs this process in real time. In some embodiments, the microprocessor 218 discretely performs this process in real time.

Figure 5A:
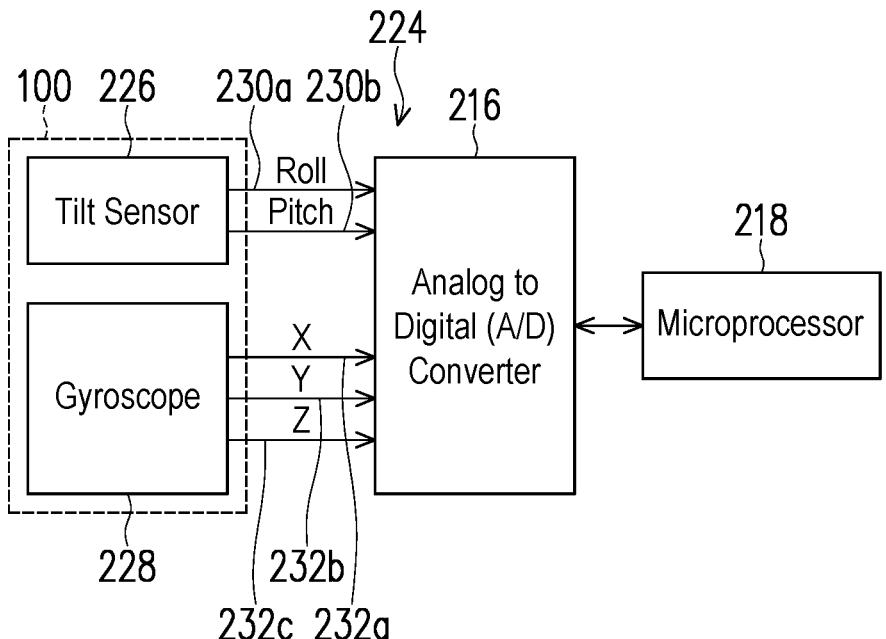
FIG. 5A is a block diagram of one or more sensors monitoring characteristics of a coolant tank, in accordance with some embodiments.
Figure 5B:
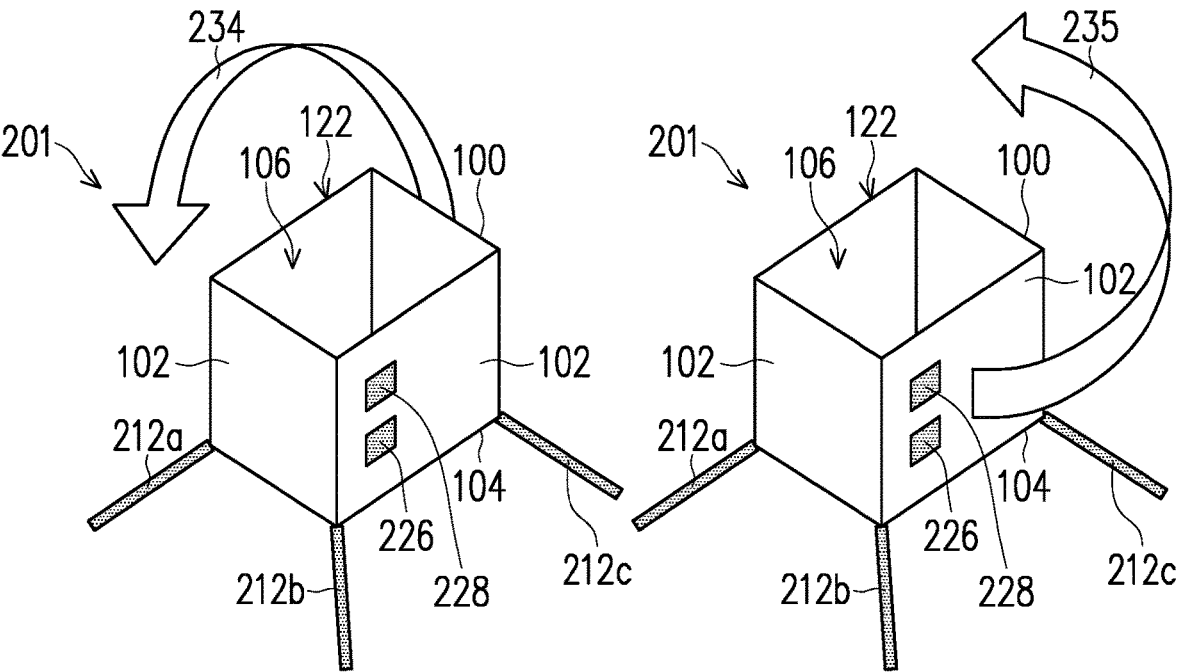
FIG. 5B are perspective views of characteristics of the coolant tank monitored by the one or more sensors of the block diagram as shown in FIG. 5A, in accordance with some embodiments.

FIG. 5A is a block diagram 224 of one or more sensors monitoring characteristics of the coolant tank 100 of the automatic leveling immersion cooling tank system 201, in accordance with some embodiments. FIG. 5B are perspec-tive views of characteristics of the coolant tank monitored by the one or more sensors of the block diagram as shown in FIG. 5A, in accordance with some embodiments.

As shown in the block diagram 224 in FIG. 5A, a tilt sensor 226 and a gyroscope or accelerometer 228 are coupled to the coolant tank 100. The tilt sensor 226 is configured to, in operation, monitor a tilting of the coolant tank 100 (e.g., pitch and roll) and the gyroscope 228 is configured to, in operation, monitor angular motion of the coolant tank 100. While not shown, the gyroscope 228 may include one or more magnetic or magnetometer sensors to monitor angular motion of the coolant tank 100 about one or more axes (e.g., the x-axis, the y-axis, and the z-axis). For example, the gyroscope 228 may include three magnetic sensors to monitor angular motion about three different axes (e.g., the x-axis, the y-axis, and the z-axis).

In some embodiments, the gyroscope 228 may be replaced with one or more accelerometers or acceleration sensors to detect motion such as angular motion of the coolant tank 100.

The tilt sensor 226 and the gyroscope 228 are in electrical communication with the A/D converter 216. The tilt sensor 226 outputs one or more tilt signals 230a, 230b and the gyroscope 228 outputs one or more angular motion signals 232a, 232b, 232c. In this embodiment, the one or more tilt signals 230a, 230b includes a first tilt signal 230a that is representative of a measurement of tilt in a pitch direction (see, e.g., an arrow 234 as shown in FIG. 5B representative of the pitch direction) and a second tilt signal 230b that is representative of a measurement of tilt in a roll direction (see, e.g., an arrow 235 as shown in FIG. 5B representative of the roll direction).

The tilt detected and measured by the tilt sensor 226 may be due to the ground surface 116 being unlevel as discussed earlier herein with respect to FIG. 1B. The angular motion and tilt detected and measured by the gyroscope 228 and the tilt sensor 226, respectively, may be due to the vibration 128 as discussed earlier herein with respect to FIG. 1C.

The tilt sensor 226 and the gyroscope 228 output the tilt signals 230a, 230b and the angular motion signals 232a, 232b, 232c representative of the measurement of tilt and angular motion of the coolant tank 100. The microprocessor 218 then utilizes these electrical signals, which passed through the A/D converter 216, to determine the tilt, the position, or both of the coolant tank 100 and determine whether the coolant tank 100 is undergoing any current angular motion. For example, once the tilt, the position, and the angular motion of the coolant tank 100 are determined, the microprocessor 218 may utilize this information either alone or along with other information collected and pro-cessed by the microprocessor 218 (e.g., the lengths L1, L2, L3 of the one or more actuators 212a, 212b, 212c, the surface level of the coolant 108 within the coolant tank 100, the position of the coolant tank 100, or other similar or like type of information with respect to the automatic leveling immersion cooling tank system 201), the microprocessor 218 outputs one or more control signals that results in respective motors of the one or more motors 214a, 214b, 214c providing power to respective actuators of the one or more actuators 212a, 212b, 212c. The microprocessor 218 makes various determinations and outputs various control signals in real time to automatically adjust the one or more actuators 212a, 212b, 212c based on the tilt and the angular motion of the coolant tank 100 to prevent or reduce the likelihood of spilling and improve the efficiency of the cooling system 200 to cool and maintain the temperatures of the one or more electronic components 110 immersed (e.g., partially submerged or fully submerged) within the coolant 108. The microprocessor may perform this process in real time based on the tilt and the angular motion, which may be occurring in real time. In some embodiments, the microprocessor continuously performs this process in real time. In some embodiments, the microprocessor discretely performs this process in real time.

Figure 6:
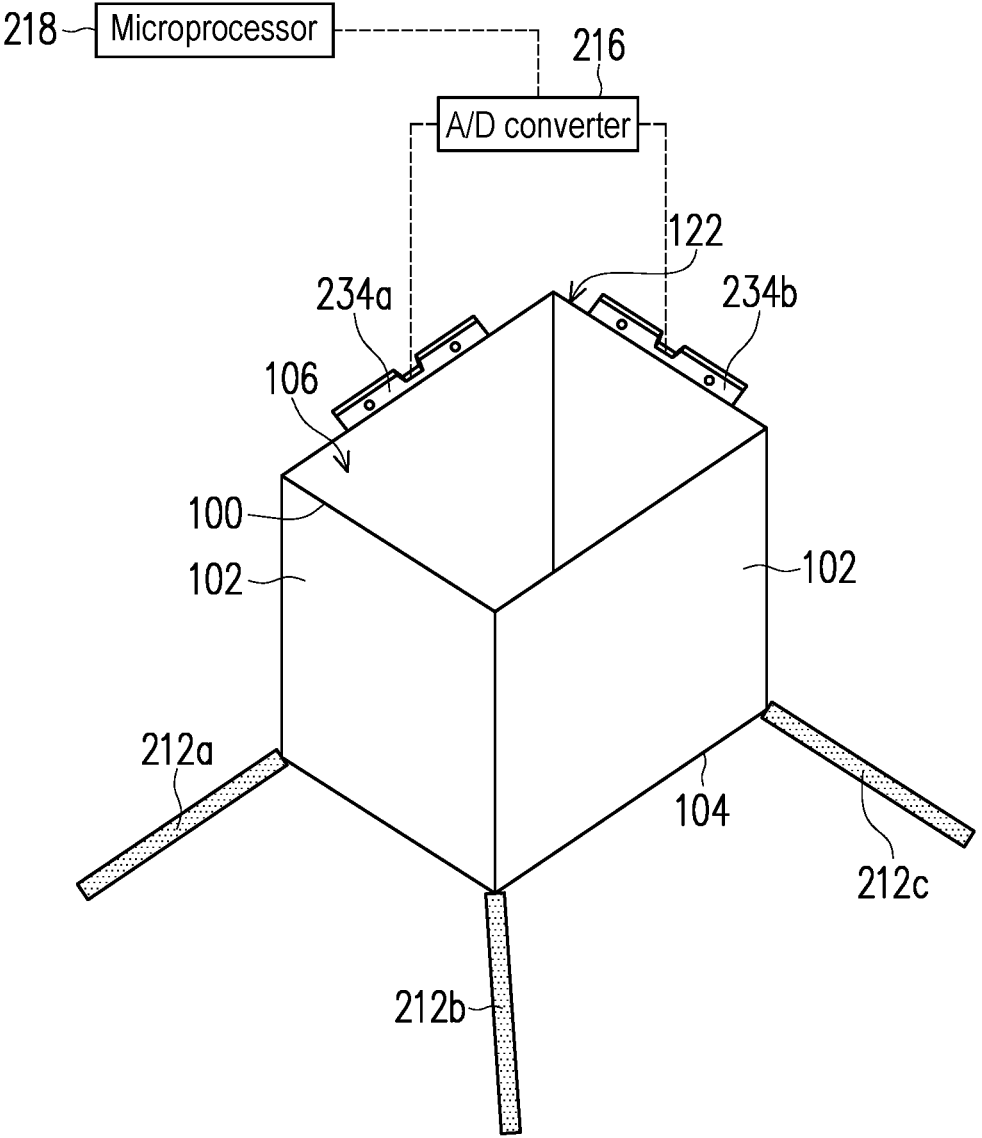
FIG. 6 is a perspective view of one or more sensors monitoring characteristics of a coolant tank, in accordance with some embodiments.

FIG. 6 is a perspective view of one or more sensors monitoring characteristics of a coolant tank, in accordance with some embodiments.

As shown in FIG. 6, one or more level sensors 234*a*, 234*b* are coupled to the coolant tank 100. In this embodiment, the one or more level sensors 234*a*, 234*b* include a pair of level sensors 234*a*, 234*b* that include a first level sensor 234*a* and a second level sensor 234*b*. The first and second level sensors 234*a*, 234*b* are positioned at respective upper ends 122 of the one or more sidewalls 102 of the coolant tank 100. The first level sensor 234*a* is positioned at a first upper end of a first sidewall of the one or more sidewalls 102 and the second level sensor 234*b* is positioned at a second upper end of a second sidewall of the one or more sidewalls 102 that is transverse to the first sidewall of the one or more side-walls. In some embodiments, the one or more level sensors 234*a*, 234*b* may be that are provided along various ones of the upper ends 122 of the one or more sidewalls 102, along respective internal and external surfaces of the one or more sidewalls 102, and along respective internal and external surfaces of the bottom end 104 of the coolant tank 100. In some embodiments, there may be only one level sensor instead of a pair of level sensors or a greater number of level sensors. In some embodiments, multiple level sensors may be provided along the same axis either in close proximity to each other or spaced apart from each other such that multiple measurements of the levelness of the coolant tank 100 may be collected to improve accuracy in results output by the microprocessor 218.

The levelness detected and measured by the one or more level sensors 234*a*, 234*b* may be due to the ground surface 116 being unlevel as discussed earlier herein with respect to FIG. 1B. The levelness detected and measured by the one or more level sensors 234*a*, 234*b* may be due to the vibration 128 as discussed earlier herein with respect to FIG. 1C.

The one or more level sensors 234*a*, 234*b* are in electrical communication either wired or wirelessly with the A/D converter 216. The one or more level sensors 234*a*, 234*b* output one or more level signals representative of the measurement of levelness of the coolant tank 100. These one or more level signals may be similar to the one or more tilt signals 230*a*, 230*b* as discussed earlier herein with respect to the one or more tilt sensors 226. The microprocessor 218 then utilizes these electrical signals, which passed through the A/D converter 216, to determine the levelness, the position, or both of the coolant tank 100. For example, once the levelness and the position of the coolant tank 100 are determined, the microprocessor 218 may utilize this information either alone or along with other information collected and processed by the microprocessor 218 (e.g., the lengths L1, L2, L3 of the one or more actuators 212*a*, 212*b*, 212*c*, the surface level of the coolant 108 within the coolant tank 100, the position of the coolant tank 100, or other similar or like type of information with respect to the automatic leveling immersion cooling tank system 201), the microprocessor 218 outputs one or more control signals that results in respective motors of the one or more motors 214*a*, 214*b*, 214*c* providing power to respective actuators of the one or more actuators 212*a*, 212*b*, 212*c*. The microprocessor 218 makes various determinations and outputs various control signals in real time to automatically adjust the one or more actuators 212*a*, 212*b*, 212*c* based on the levelness of the coolant tank 100 to prevent or reduce the likelihood of spilling and improve the efficiency of the cooling system 200 to cool and maintain the temperatures of the one or more electronic components 110 immersed (e.g., partially sub-merged or fully submerged) within the coolant 108. The microprocessor may perform this process in real time based on the levelness of the coolant tank 100, which may be occurring in real time. In some embodiments, the micropro-cessor continuously performs this process in real time. In some embodiments, the microprocessor discretely performs this process in real time.

Figure 7:
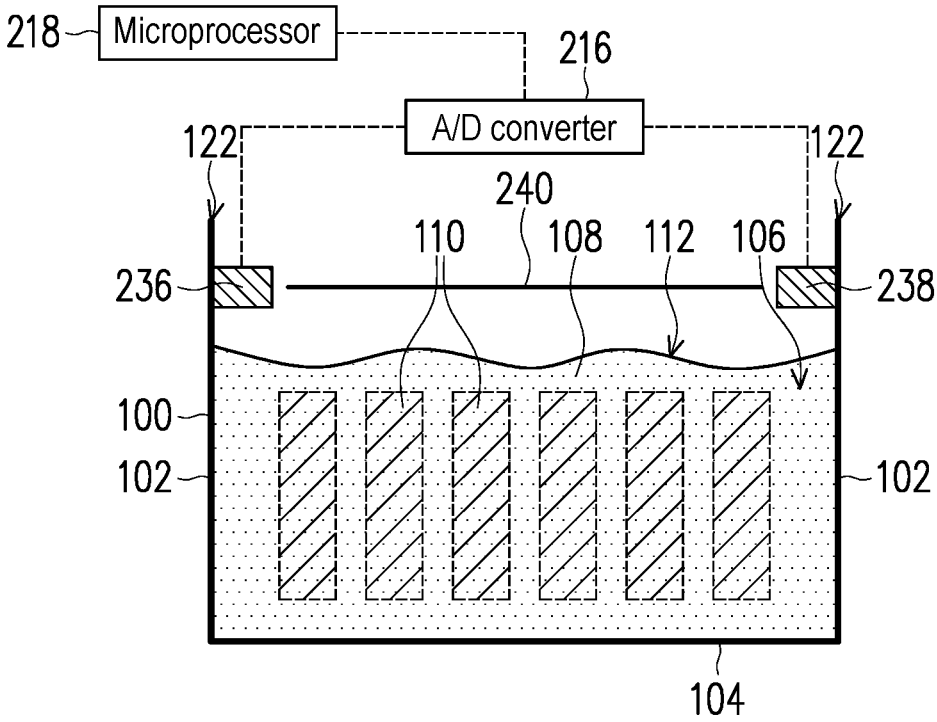
FIG. 7 is a cross-sectional side view of one or more sensors monitoring characteristics of a coolant tank, in accordance with some embodiments.

FIG. 7 is a cross-sectional side view of one or more sensors monitoring characteristics of a coolant tank, in accordance with some embodiments.

As shown in FIG. 7, a first transceiver 236 and a second transceiver 238 are at internal surfaces of opposite sidewalls of the one or more sidewalls 102 of the coolant tank 100. The first transceiver 236 may be an emitter that emits a laser 240 and the second transceiver 238 may be a detector that detects the laser 240 emitted by the first transceiver 236. The first and second transceivers 236, 238 are aligned with each other such that when the first transceiver 236 emits the laser, the second transceiver 238 readily receives and detects the laser 240.

In some embodiments, the first and second transceivers 236, 238 may be some other suitable type of optical sensors.

The laser 240 is generated to detect when the surface level 112 of the coolant 108 within the coolant tank 100 or the portion 120 of the coolant 108 passes into the path of the laser 240. The coolant 108 passing into the path of the laser 240 interrupts the laser 240 from being received by the second transceiver 238. When the laser 240 is interrupted, an interrupt signal may be output by either one of the first and second transceiver 236, 238 and output to the A/D converter 216. This interrupt signal may then be processed by the A/D converter 216 and sent to the microprocessor 218 for further processing. Based on this detection of the interrupt in the laser 240, the microprocessor 218 utilizes this indication of the interrupt in the laser 240 to determine whether control signals are to be output to the one or more motors 214*a*, 214*b*, 214*c* to actuate the one or more actuators 212*a*, 212*b*, 212*c* to rotate and move the coolant tank 100. In this determination, the microprocessor 218 may utilize this information either alone or along with other information collected and processed by the microprocessor 218 (e.g., the lengths L1, L2, L3 of the one or more actuators 212*a*, 212*b*, 212*c*, the surface level of the coolant 108 within the coolant tank 100, the position of the coolant tank 100, or other similar or like type of information with respect to the automatic leveling immersion cooling tank system 201). Once the microprocessor 218 outputs the one or more control signals, the respective motors of the one or more motors 214*a*, 214*b*, 214*c* receive power to actuate respective actuators of the one or more actuators 212*a*, 212*b*, 212*c*. The microprocessor 218 makes various determinations and out-puts various control signals in real time to automatically adjust the one or more actuators 212*a*, 212*b*, 212*c* based on the interruption of the laser 240 to prevent or reduce the likelihood of spilling and improve the efficiency of the cooling system 200 to cool and maintain the temperatures of the one or more electronic components 110 immersed (e.g., partially submerged or fully submerged) within the coolant 108. The microprocessor may perform this process in real time based on the interruption of the laser 240, which may be occurring in real time. In some embodiments, the micro-processor continuously performs this process in real time. In some embodiments, the microprocessor discretely performs this process in real time.

Figure 8:
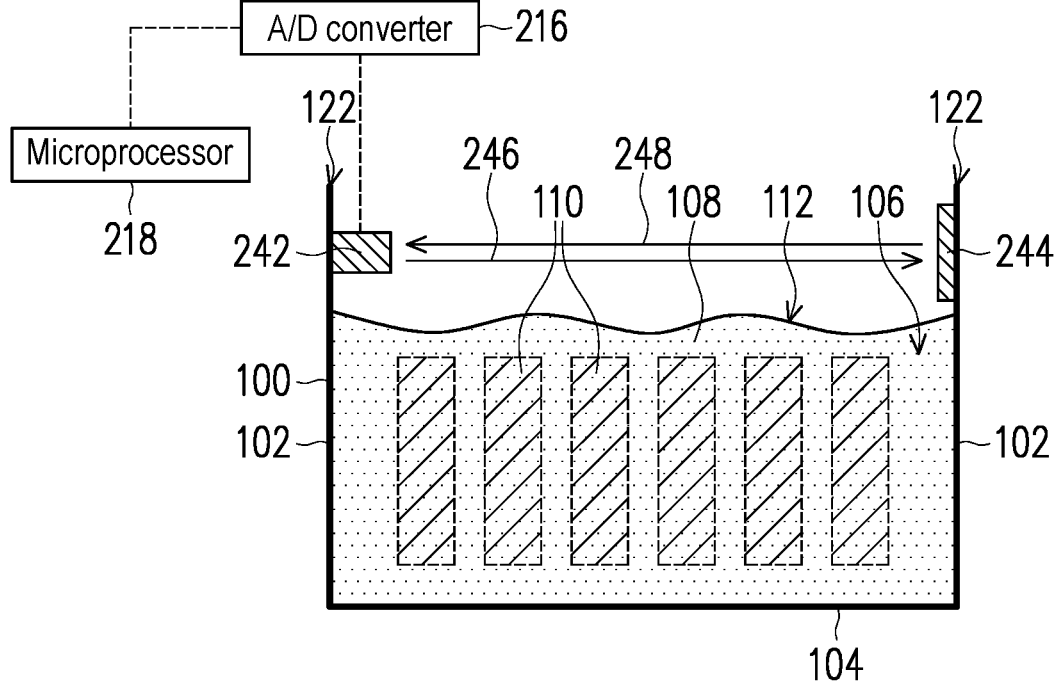
FIG. 8 is a cross-sectional side view of one or more sensors monitoring characteristics of a coolant tank, in accordance with some embodiments.

FIG. 8 is a cross-sectional side view of one or more sensors monitoring characteristics of a coolant tank, in accordance with some embodiments.

As shown in FIG. 8, a transceiver 242 and a mirror 244 are at internal surfaces of opposite sidewalls of the one or more sidewalls 102 of the coolant tank 100. The transceiver 242 may include a laser emitter (not shown) and a laser detector (not shown). The laser emitter of the transceiver 242 emits an emitted laser 246 at the mirror 244 as the mirror 244 is aligned with the transceiver 242. The emitted laser 246 reflects off the mirror 244 and becomes a reflected laser 248 that is directed back at the transceiver 242. The reflected laser 248 is detected by the laser detector of the transceiver 242. In some embodiments, the transceiver 242 may be a time-of-flight (TOF) sensor.

The emitted laser 246 and the reflected laser 248 are generated to detect when the surface level 112 of the coolant 108 within the coolant tank 100 or the portion 120 of the coolant 108 passes into the path of emitted laser 246 and the reflected laser 248. The coolant 108 passing into the path of the emitted laser 246, the reflected laser 248, or both interrupts the reflected laser 248 from being received by the light detector of the transceiver 242. When the reflected laser 248 is interrupted from being received by the light detector of the transceiver 242, an interrupt signal may be output by the transceiver 242 and output to the A/D converter 216. This interrupt signal may then be processed by the A/D converter 216 and sent to the microprocessor 218 for further processing. Based on this detection of the interrupt signal in the reflected laser 248 being received by the light detector of the transceiver 242, the microprocessor 218 utilizes this indication of the interrupt signal in the reflected laser 248 from being received by the light detector of the transceiver 242 to determine whether control signals are to be output to the one or more motors 214a, 214b, 214c to actuate the one or more actuators 212a, 212b, 212c to rotate and move the coolant tank 100. In this determination, the microprocessor 218 may utilize this information either alone or along with other information collected and processed by the microprocessor 218 (e.g., the lengths L1, L2, L3 of the one or more actuators 212a, 212b, 212c, the surface level of the coolant 108 within the coolant tank 100, the position of the coolant tank 100, or other similar or like type of information with respect to the automatic leveling immersion cooling tank system 201). Once the microprocessor 218 outputs the one or more control signals, the respective motors of the one or more motors 214a, 214b, 214c receive power to actuate respective actuators of the one or more actuators 212a, 212b, 212c. The microprocessor 218 makes various determinations and outputs various control signals in real time to automatically adjust the one or more actuators 212a, 212b, 212c based on the interruption of the laser 240 to prevent or reduce the likelihood of spilling and improve the efficiency of the cooling system 200 to cool and maintain the temperatures of the one or more electronic components 110 immersed (e.g., partially submerged or fully submerged) within the coolant 108. The microprocessor may perform this process in real time based on the interruption of the laser 240, which may be occurring in real time. In some embodiments, the microprocessor continuously performs this process in real time. In some embodiments, the microprocessor discretely performs this process in real time.

Figure 9A:
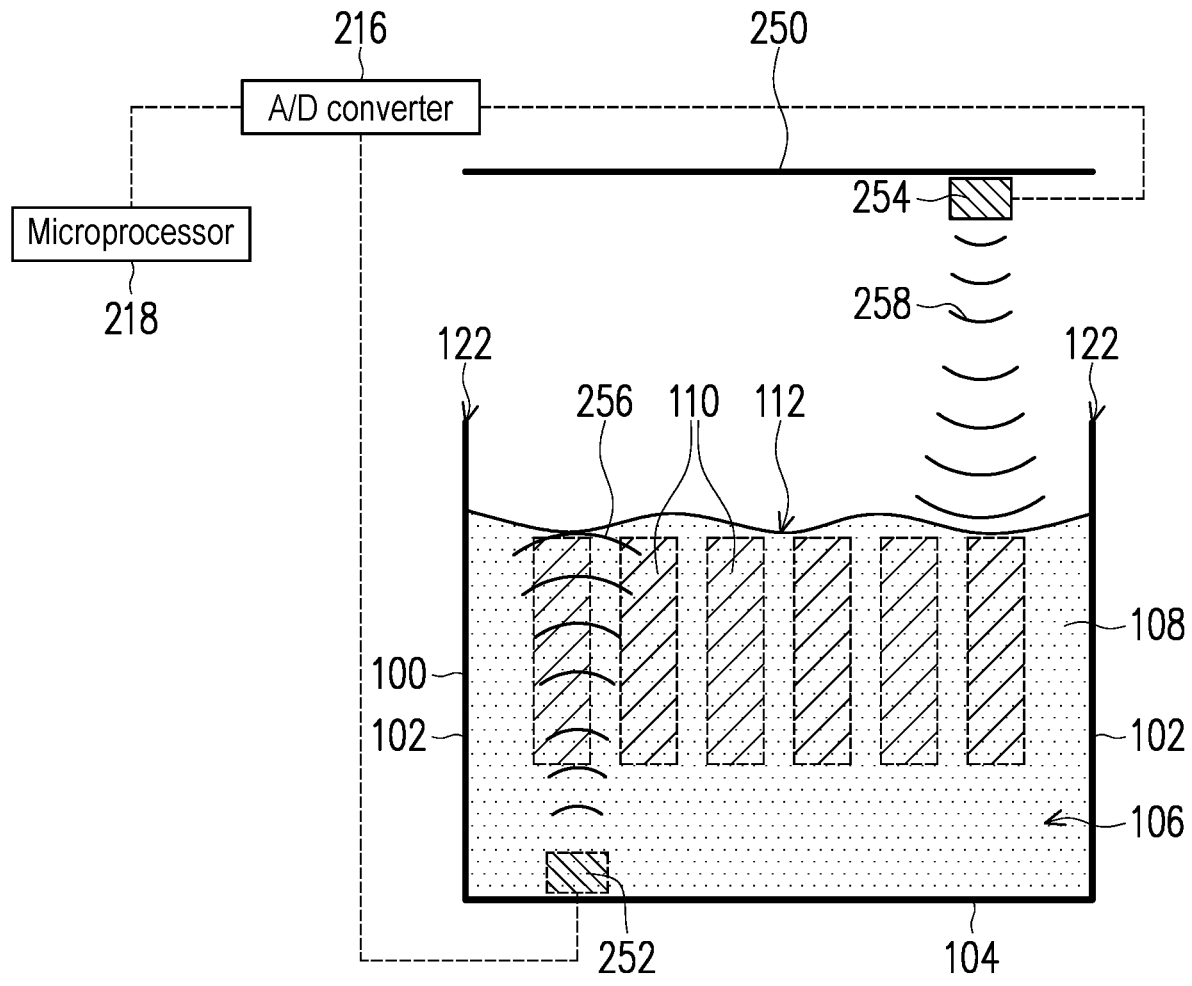
FIG. 9A is a cross-sectional side view of one or more sensors monitoring characteristics of a coolant tank including a lid removed from the coolant tank, in accordance with some embodiments.
Figure 9B:
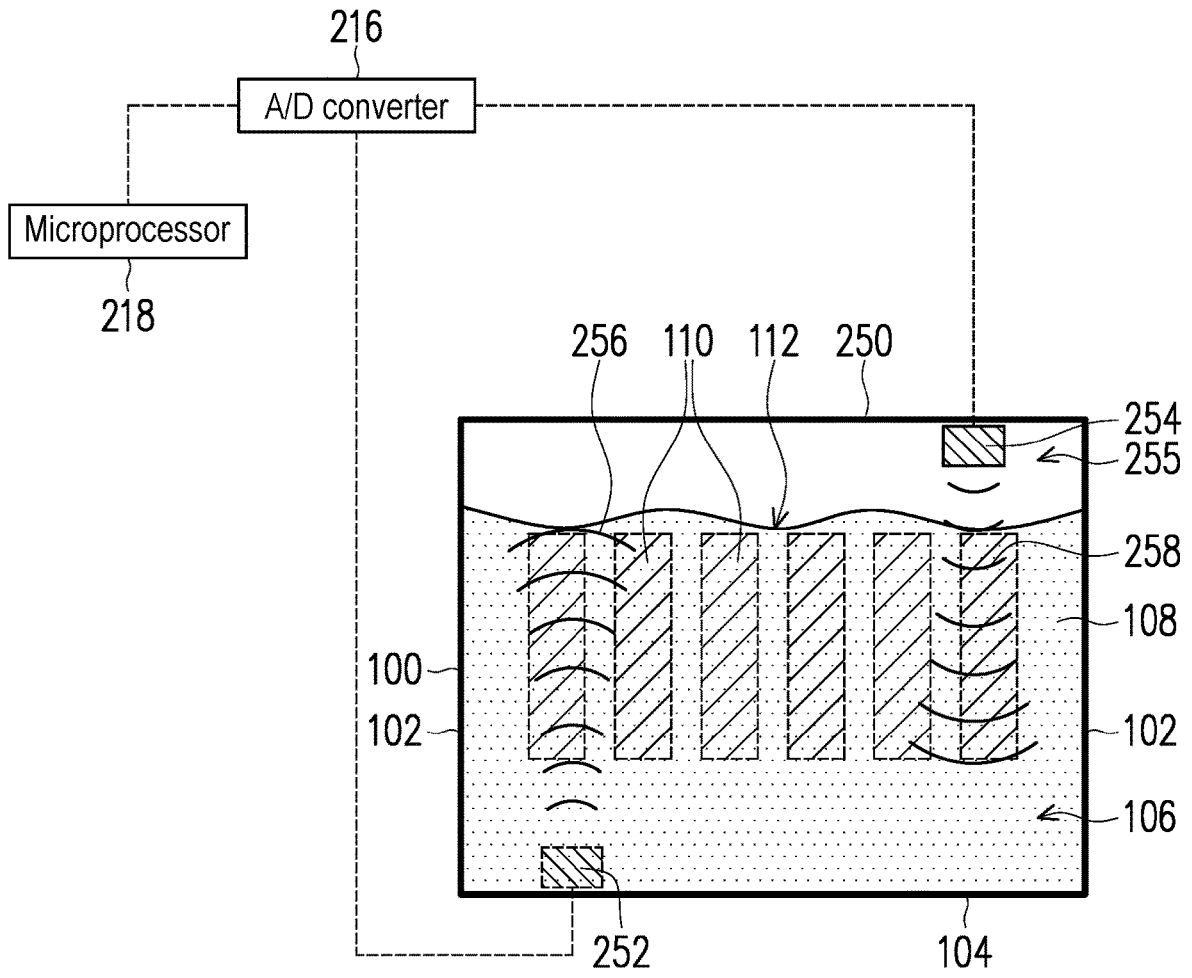
FIG. 9B is a cross-sectional side view of the one or more sensors monitoring characteristics of the coolant tank with the lid mounted to the coolant tank as shown in FIG. 9A, in accordance with some embodiments.

FIG. 9A is a cross-sectional side view of one or more sensors monitoring characteristics of a coolant tank including a lid removed from the coolant tank, in accordance with some embodiments. FIG. 9B is a cross-sectional side view of the one or more sensors monitoring characteristics of the coolant tank with the lid mounted to the coolant tank as shown in FIG. 9A, in accordance with some embodiments.

As shown in FIGS. 9A, a lid 250 is mountable to the coolant tank 100. For example, the lid 250 may mechanically engage with the upper ends 122 of the one or more sidewalls 102 of the coolant tank 100 such that the cavity 106 of the coolant tank 100 is sealed shut to prevent spilling of the coolant 108 out of the coolant tank 100. A first wave sensor 252 is coupled to an internal surface of the bottom end 104 of the coolant tank 100, and a second wave sensor 254 is coupled to an internal surface of the lid 250. For example, as shown in FIG. 9B, the coolant 108 takes up a first portion of the cavity 106 and the air takes up a space 255, which takes up a second portion of the cavity 106, when the lid 250 is mounted to the coolant tank 100.

As shown in FIG. 9B, when the lid 250 is mounted to the coolant tank 100, the cavity 106 is delimited by the internal surfaces of the one or more sidewalls 102 of the coolant tank 100, the internal surface of the bottom end 104 of the coolant tank 100, and the internal surface of the lid 250. When the lid 250 is mounted to the coolant tank 100, the second wave sensor 254 is spaced apart and is over the surface level 112 of the coolant 108 stored within the coolant tank 100. In other words, the first wave sensor 252 is within the coolant 108 and the second wave sensor 254 is within air that is present within a space 255 located between the surface level 112 of the coolant 108 and the internal surface of the lid 250.

The first wave sensor 252 outputs one or more first waves 256. The second wave sensor 254 outputs one or more second waves 258. The first and second wave sensors 252, 254 are in electrical communication either wired or wirelessly with the A/D converter 216. The first wave sensor 252 generates the one or more first waves 256 and detects reflected waves. The second sensor 254 generates the one or more second waves 258 and detects reflected waves.

In operation, the first wave sensor 252 and the second wave sensor 254 are utilized to determine a position of the surface level 112 of the coolant 108 by determining the position of the interface between the air within the space 255 and the coolant 108. This interface between the air within the space 255 and the coolant 108 is present at the surface level 112 of the coolant 108.

In operation, the first wave sensor 252 generates the one or more first waves 256 that are directed away from the bottom end 104 of the coolant tank 100 and towards the interface at the surface level 112. After generation, as the one or more first waves 256 reach the interface at the surface level 112, the one or more first waves 256 fully or partially reflect off the interface at the surface level 112. These reflected waves (not shown) move away from the interface at the surface level 112 back towards the first wave sensor 252. Once these reflected waves reach the first wave sensor 252, the first wave sensor 252 detects the reflected waves and outputs a signal that is provided to the A/D converter 216. The A/D converter 216 processes the signal output by the first wave sensor 252 and outputs a signal to the microprocessor 218 that the microprocessor 218 processes to determine the position of the surface level 112.

In operation, the second wave sensor 254 generates the one or more second waves 258 that are directed away from the lid 250 of the coolant tank 100 and towards the interface at the surface level 112. After generation, as the one or more second waves 258 reach the interface at the surface level 112, the one or more second waves 258 fully or partially reflect off the interface at the surface level 112. These reflected waves (not shown) move away from the interface at the surface level 112 back towards the second wave sensor 254. Once these reflected waves reach the second wave sensor 254, the second wave sensor 254 detects the reflected waves and outputs a signal that is provided to the A/D converter 216. The A/D converter 216 processes the signal output by the second wave sensor 252 and outputs a signal to the microprocessor 218 that the microprocessor 218 processes to determine the position of the surface level 112.

The microprocessor 218 utilizes the information collected from the first and second wave sensors 252, 254, respectively, to determine the position of the surface level 112. If the microprocessor 218 determines that the surface level 112 is at a position in which the one or more electronic components 110 are properly immersed (e.g., partially or fully submerged within the coolant 108 depending on a depth of the coolant 108 present within the coolant tank 100), the microprocessor 218 does not output any control signals to the one or more motors 214a, 214b, 214c. Alternatively, if the microprocessor determines that the surface level 112 is at a position in which the one or more electronic components 110 are not properly immersed (e.g., partially or fully submerged within the coolant 108 depending on a depth of the coolant 108 present within the coolant tank 100), the microprocessor 218 does output one or more control signals to the one or more motors 214a, 214b, 214c to adjust the position of the coolant tank 100 such that the surface level 112 is adjusted in position and the one or more electronic components 110 become properly immersed (e.g., partially or fully submerged within the coolant 108 depending on a depth of the coolant 108 present within the coolant tank 100) within the coolant 108 present within the coolant tank 100.

In some embodiments, the first wave sensor 252 and the second wave sensor 254 may be ultrasound wave sensors that propagate ultrasound waves. In some embodiments, the first wave sensor 252 and the second wave sensor 254 may propagate waves different from ultrasound waves. In some embodiments, the first wave sensor 252 and the second wave sensor 254 may generate waves with the same or similar wavelength. In some embodiments, the first wave sensor and the second wave sensor may generate waves with different wavelengths. For example, the waves generated by the first wave sensor 252 and the second wave sensor 254 may be ultrasound waves, electromagnetic waves, radar waves, or some other suitable type of wave with a suitable wavelength for detecting the position of the surface level 112 of the coolant 108.

Figure 10A:
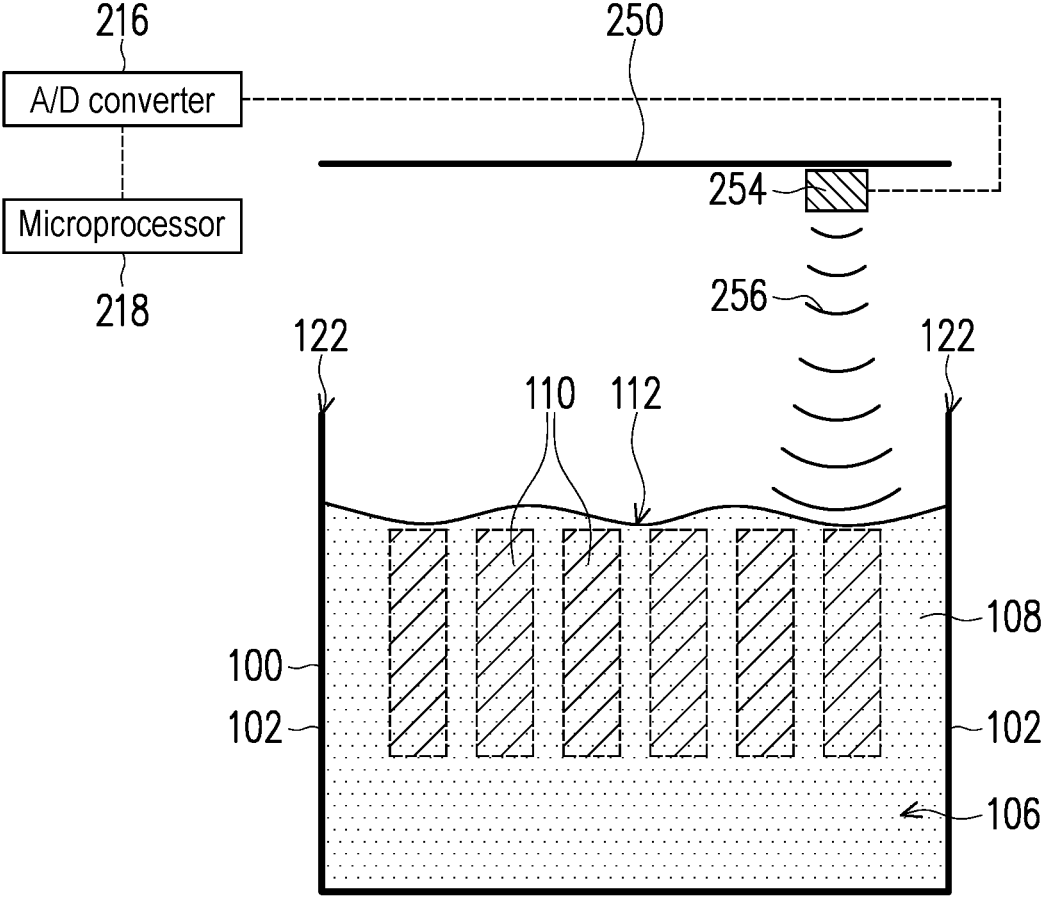
FIG. 10A is a cross-sectional side view of a coolant tank including a lid removed from the coolant tank, in accordance with some embodiments.
Figure 10B:
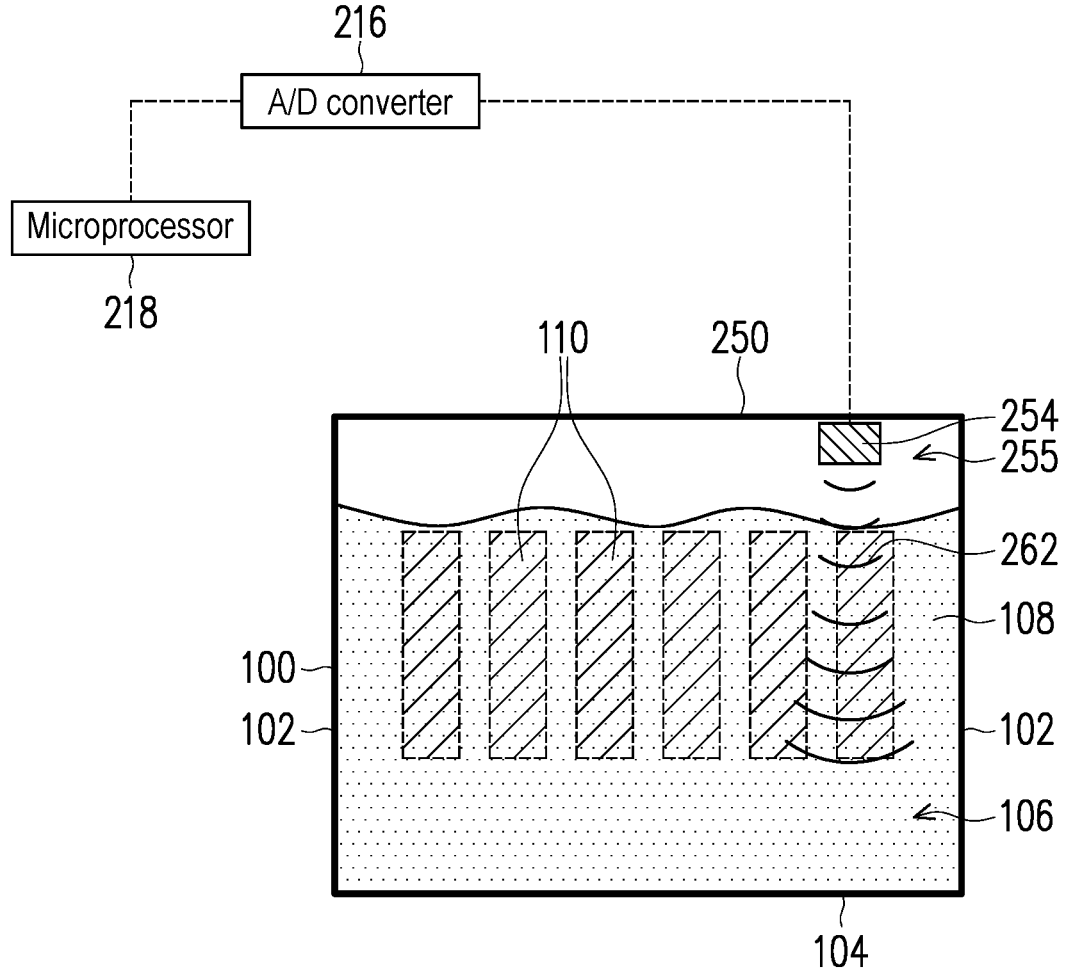
FIG. 10B is a cross-sectional side view of the one or more sensors monitoring characteristics of the coolant tank with the lid mounted to the coolant tank as shown in FIG. 10A, in accordance with some embodiments.

In some embodiments, only one of the first wave sensor 252 and the second wave sensor 254 may be provided and present (see FIGS. 10A and 10B of the present disclosure). In some embodiments, there is a plurality of wave sensors including the first wave sensor 252 and the second wave sensor 254 that is provided at different positions along an internal surface delimiting the cavity 106 of the coolant tank 100 to provide further feedback and more accurate feedback with respect to the position of the surface level 112.

FIG. 10A is a cross-sectional side view of one or more sensors monitoring characteristics of a coolant tank including a lid removed from the coolant tank, in accordance with some embodiments. FIG. 10B is a cross-sectional side view of the one or more sensors monitoring characteristics of the coolant tank with the lid mounted to the coolant tank as shown in FIG. 10A, in accordance with some embodiments. As shown in FIGS. 10A and 10B, only the second wave sensor 254 is present on the internal surface of the lid 250. In an alternative embodiment, the second wave sensor 254 is not present on the internal surface of the lid 250, and, instead, the first wave sensor 252 is present at the internal surface of the bottom end 104.

The functionality of the second wave sensor 254 as shown in FIGS. 10A and 10B is the same or similar to the functionality of the second wave sensor 254 as discussed above with respect to FIGS. 9A and 9B. Accordingly, for the sake of simplicity and brevity of the present disclosure, the discussion of the functionality of the second wave sensor 254 when in operation is not reproduced here.

Figure 11:
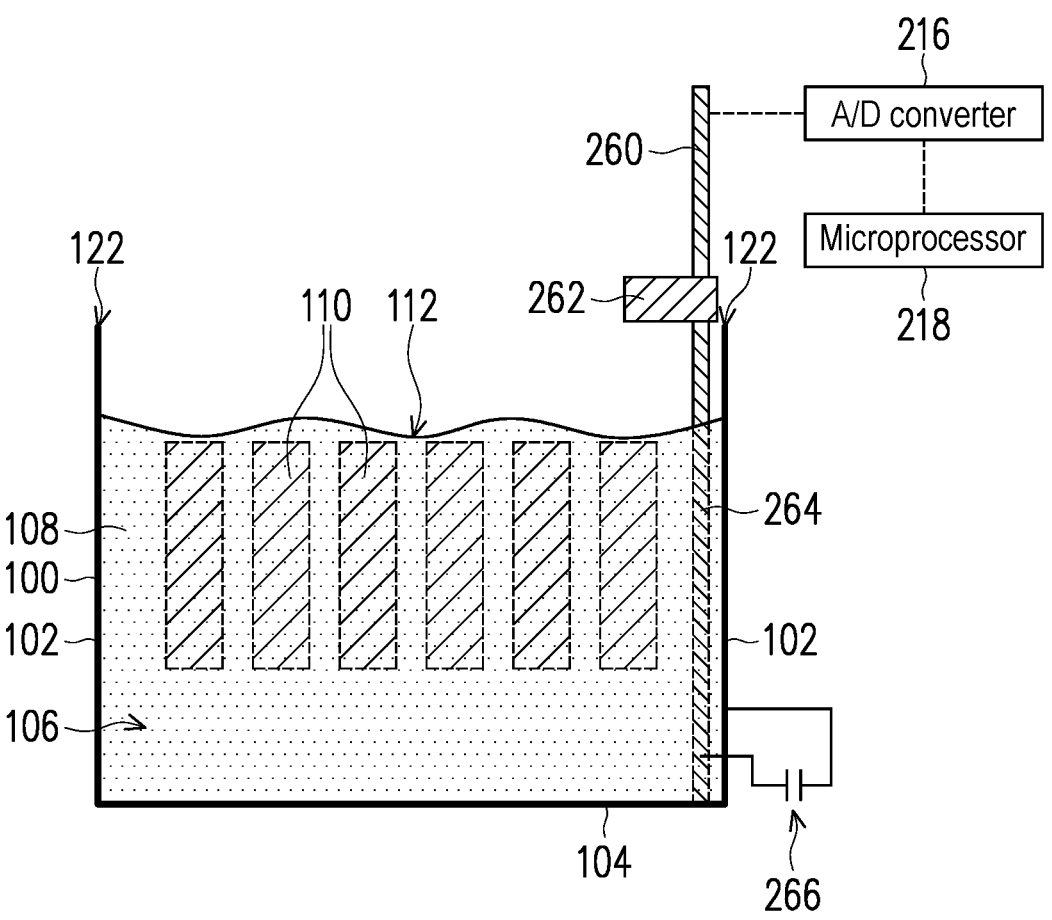
FIG. 11 is a cross-sectional side view of one or more sensors monitoring characteristics of a coolant tank, in accordance with some embodiments.

FIG. 11 is a cross-sectional side view of one or more sensors monitoring characteristics of a coolant tank, in accordance with some embodiments. As shown in FIG. 11, a surface level sensor 260 extends into the coolant 108 and is immersed within the coolant 108 within the coolant tank 100. In this embodiment, the surface level sensor 260 extends from the bottom end 104 of the coolant tank 100 at least up to the upper ends 122 of the one or more sidewalls 102 of the coolant tank 100. In this embodiment, the surface level sensor 260 includes a probe head 262 and a probe 264. The probe head 262 may contain active and passive electrical components for outputting a signal to the A/D converter 216. The probe 264 extends into the coolant 108 and is immersed within the coolant 108 within the coolant tank 100.

The surface level sensor 260 may be a capacitance surface level sensor that forms a capacitor 266 between the probe 264 and a respective sidewall of the one or more sidewalls 102 in close proximity to the probe 264. In this embodiment, the respective sidewall of the one or more sidewalls 102 in close proximity to the probe 264 is the respective sidewall of the one or more sidewalls 102 at the right-hand side of FIG. 11. As the surface level 112 of the coolant 108 aligned with and overlying the probe 264 increases (i.e., depth of coolant 108 increases), a capacitance of the capacitor 266 increases, and, alternatively, as the surface level 112 of the coolant 108 aligned with and overlying the probe decreases (i.e., depth of coolant 108 decreases), the capacitance of the capacitor 266 decreases. The microprocessor 218 may monitor these changes in the capacitance of the capacitor 266 to determine the position of the surface level to determine whether the one or more control signals need to be provided to power on the one or more motors 214a, 214b, 214c to actuate the one or more actuators 212a, 212b, 212c to move, rotate, and adjust the position of the coolant tank 100 to improve immersion of the one or more electronic components 110 within the coolant 108.

In this embodiment as shown in FIG. 11, only a single surface level sensor 260 is provided. In some alternative embodiments, a plurality of surface level sensors 260 may be provided at various locations within the coolant tank 100 in close proximity to respective sidewalls of the one or more sidewalls 102 of the coolant tank 100 such that the position and depth of the surface level 112 of the coolant 108 may more accurately be determined by the microprocessor as additional data points are provided at various locations.

The respective sensors 220, 226, 228, 234a, 234b, 236, 238, 242, 244, 252, 254, 260 as discussed above with respect to FIGS. 4, 5A, 5B, 6, 7, 8, 9A, 9B, 10A, 10B, and 11 may be combined together in various fashions to optimize functionality of the automatic leveling immersion cooling tank system 201. In other words, various combinations of the respective sensors 220, 226, 228, 234a, 234b, 236, 238, 242, 244, 252, 254, 260 at varying selected locations along the coolant tank 100 can provide different types of information and data to the microprocessor 218, which can then be processed by the microprocessor 218 to in real time adjust the position of the coolant tank 100 to prevent or reduce the likelihood of spillage or to improve or maintain immersion or submersion of the one or more electronic components 110 within the coolant 108. By providing different numbers, types, and combinations of these varying sensors along the coolant tank 100, the microprocessor is capable of more accurately determining the position of the surface level 112, the position of the coolant tank 100, and accurately and quickly move, rotate, and adjust the position of the coolant tank 100 to improve overall efficiency of the automatic leveling immersion cooling tank system 201 while at the same time preventing or reducing the likelihood of the coolant 108 from spilling out of the coolant tank 100 when the lid 250 is not mounted to the coolant tank 100.

Figure 12:
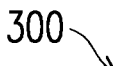
FIG. 12 is a flowchart of a method of adjusting a position of a coolant tank utilizing an automatic leveling immersion cooling tank system, in accordance with some embodiments.
Figure 12:
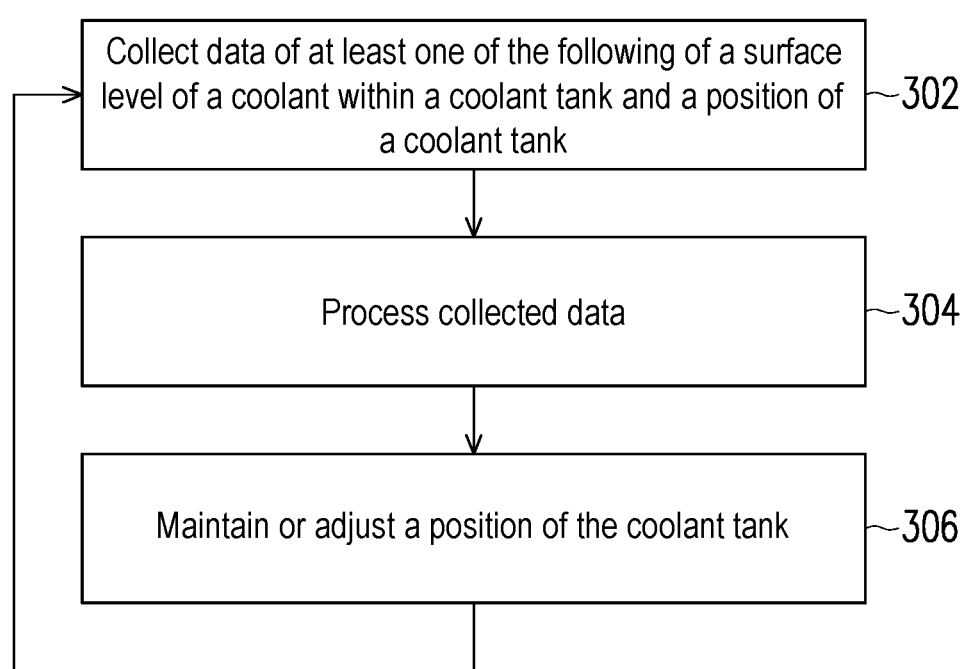

FIG. 12 is a flowchart 300 of a method of adjusting a position of a coolant tank utilizing the automatic leveling immersion cooling tank system 201 as shown in FIGS. 2 and 3, in accordance with some embodiments. The flowchart 300 of the method of adjusting the position of the coolant tank utilizing the automatic leveling immersion cooling tank system 201 includes a first step 302, a second step 304, and a third step 306.

In the first step 302, the respective sensors 220, 226, 228, 234a, 234b, 236, 238, 242, 244, 252, 254, 260 detect various characteristics of the surface level 112 of the coolant 108, the position of the coolant tank 100, or some other suitable type of quantity, quality, or characteristics with respect to the coolant 108 and the coolant tank 100 that may be utilized by the microprocessor 218 to determine whether the position of the coolant tank 100 is to be moved, rotated, and adjusted to optimize efficiency of the automatic leveling immersion cooling tank system 201, as well as prevent or reduce the likelihood of the coolant 108 spilling from the coolant tank 100 when the lid 250 is not mounted to the coolant tank 100. In this first step 302, the respective sensors 220, 226, 228, 234a, 234b, 236, 238, 242, 244, 252, 254, 260 collect the data to which they are configured to detect in operation and output one or more sensor signals.

In the first step 302, the respective sensors 220, 226, 228, 234a, 234b, 236, 238, 242, 244, 252, 254, 260 detect various characteristics of the surface level 112 of the coolant 108, the position of the coolant tank 100, or some other suitable type of quantity, quality, or characteristics with respect to the coolant 108 and the coolant tank 100 that may be utilized by the microprocessor 218 to monitor the position of the coolant tank 100 and monitor the position of the surface level 112 to monitor efficiency of the automatic leveling immersion cooling tank system 201, as well as monitor the likelihood of the coolant 108 spilling from the coolant tank 100 when the lid 250 is not mounted to the coolant tank 100. In this first step 302, the respective sensors 220, 226, 228, 234a, 234b, 236, 238, 242, 244, 252, 254, 260 collect the data to which they are configured to detect in operation and output one or more sensor signals.

In the second step 304, the one or more sensor signals output by the respective sensors 220, 226, 228, 234a, 234b, 236, 238, 242, 244, 252, 254, 260 are output to the A/D converter 216. The A/D converter 216 then converts or processes any analog signals as needed. The digital signals and any other signals that pass through the A/D converter 216 are output to the micro[processor 218. Once the microprocessor 218 receives the signals output from the A/D converter 216, the microprocessor further processes these signals and determines whether the position of the coolant tank 100 needs to be moved, rotated, or adjusted to optimize efficiency of the automatic leveling immersion cooling tank system 201, as well as prevent or reduce the likelihood of the coolant 108 spilling from the coolant tank 100 when the lid 250 is not mounted to the coolant tank 100.

In the third step 306, when the microprocessor 218 determines that the coolant tank 100 does not need to be moved, rotated, and adjusted in position, the microprocessor 218 may not output any control signals such that the coolant tank 100 remains in the same position. Alternatively, when the microprocessor 218 determines that the coolant tank 100 does need to be moved, rotated, and adjusted in position, the microprocessor 218 outputs one or more control signals that result in at least one respective motor of the one or more motors 214a, 214b, 214c being powered out to actuate at least one respective actuator of the one or more actuators 212a, 212b, 212c to move, rotate, and adjust the position of the coolant tank 100 to optimize efficiency of the automatic leveling immersion cooling tank system 201, as well as prevent or reduce the likelihood of the coolant 108 spilling from the coolant tank 100 when the lid 250 is not mounted to the coolant tank 100.

In some embodiments, the first, second, and third steps 306 may be performed continuously such that the automatic leveling immersion coolant tank system 201 continuously in real time moves, rotates, and adjusts the position of the coolant tank 100 to optimize efficiency of the automatic leveling immersion cooling tank system 201, as well as prevent or reduce the likelihood of the coolant 108 spilling from the coolant tank 100 when the lid 250 is not mounted to the coolant tank 100. Alternatively, in some alternative embodiments, the first, second, and third steps 306 may be performed at discrete periods of time selected by a user. For example, each time a selected period of time, which may be selected by a user, passes, the method in the flowchart 300 is performed.

In view of the above discussion, the automatic leveling immersion cooling tank system 201 is an active system that is controlled by the one or more motors 214a, 214b, 214c.

Figure 13:
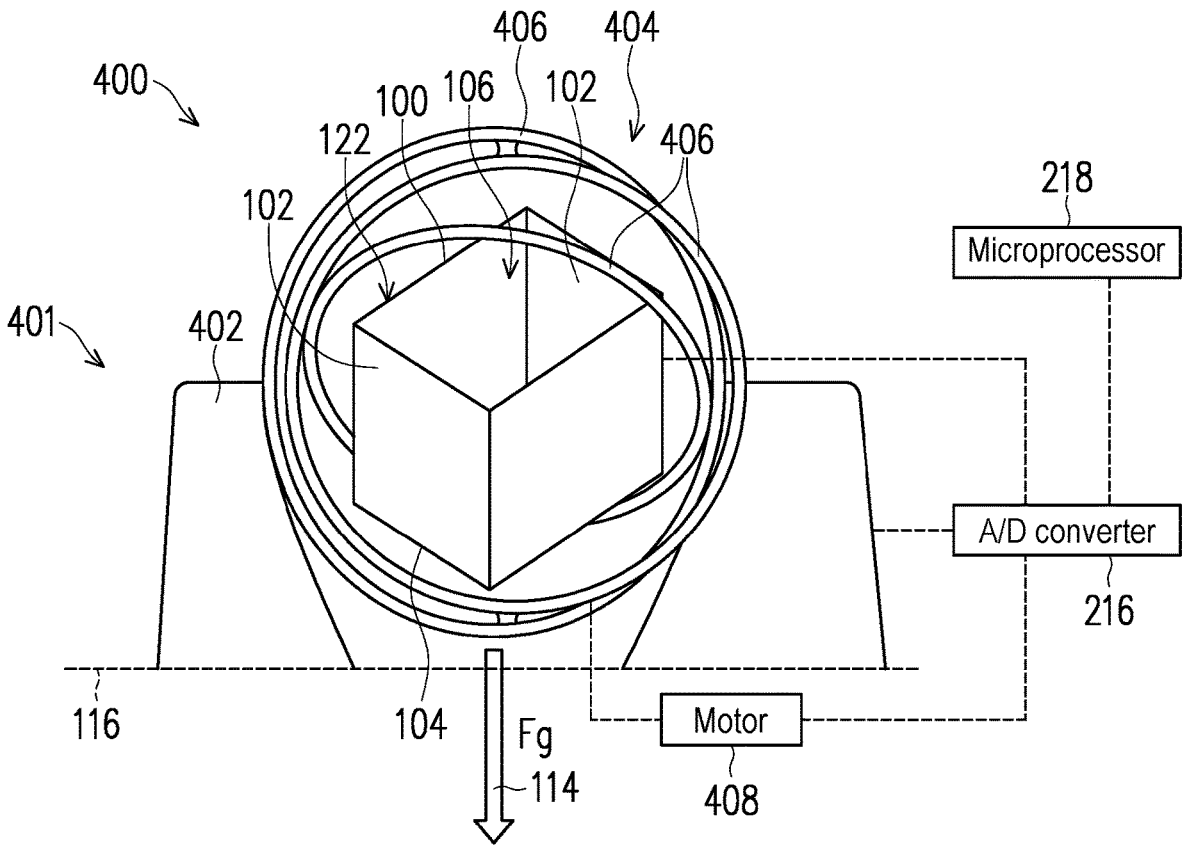
FIG. 13 is a perspective view of an automatic leveling immersion cooling tank system, in accordance with some embodiments.

FIG. 13 is a perspective view of an automatic leveling immersion cooling tank system 400, in accordance with some embodiments.

In this embodiment as shown in FIG. 13, the automatic leveling immersion cooling tank system 400, which may be utilized as an alternative of the automatic leveling immersion cooling tank system 201 as shown in FIGS. 2 and 3 of the present disclosure, a gimbal 401 includes a base 402 and a gyroscope frame 404 including one or more gimbal structures 406. In this embodiment, the one or more gimbal structures 406 include three gimbal structures such that the gimbal 401 is an aerotrim.

In this embodiment, the one or more gimbal structures 406 are in mechanical cooperation with one or more motors 408 that are in electrical communication with the A/D converter 216 either wired or wirelessly. The one or more motors 408 provide power such that the one or more gimbal structures 406 are rotated and moved to rotate, move, and adjust the position of the coolant tank 100 to optimize efficiency of the automatic leveling immersion cooling tank system 400, as well as prevent or reduce the likelihood of the coolant 108 spilling from the coolant tank 100 when the lid 250 is not mounted to the coolant tank 100.

The gimbal 401 includes three degrees of rotation about three different axes. For example, these three different axes are the x-axis, the y-axis, and the z-axis. In other words, each axis of the three axes is transverse to the other respective axes of the three different axes. These degrees of rotation allow for the one or more motors 408 to actively rotate and move the one or more gimbal structures 406 to re-position the coolant tank 100.

In some embodiments, the gimbal 401 may only include a single gimbal structure 406 such that there is only one degree of freedom (e.g., rotatable about only one axis of the x, y, and z axes). In some embodiments, the gimbal 401 may only include a pair of gimbal structures 406 such that there are only two degrees of freedom (e.g., rotatable about only two axes of the x, y, and z axes). In some embodiments, the gimbal 401 may include more than three gimbal structures 406 to provide more precise control of the position of the coolant tank 100.

Figure 14:
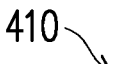
FIG. 14 is a flowchart of a method of adjusting a position of a coolant tank utilizing an automatic leveling immersion cooling tank system, in accordance with some embodiments.
Figure 14:
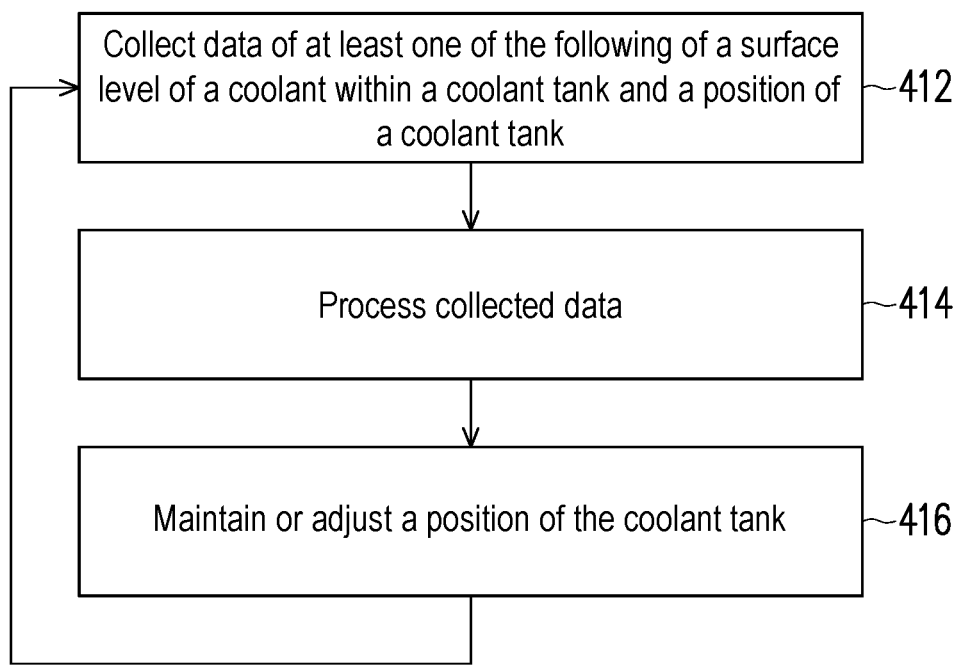

FIG. 14 is a flowchart 410 of a method of adjusting a position of the coolant tank 100 utilizing the automatic leveling immersion cooling tank system 400 as shown in FIG. 13, in accordance with some embodiments. The flowchart of the method of adjusting the position of the coolant tank 100 utilizing the automatic leveling immersion cooling tank system 400 includes a first step 412, a second step 414, and a third step 416.

In the first step 412, the respective sensors 220, 226, 228, 234*a*, 234*b*, 236, 238, 242, 244, 252, 254, 260 detect various characteristics of the surface level 112 of the coolant 108, the position of the coolant tank 100, or some other suitable type of quantity, quality, or characteristics with respect to the coolant 108 and the coolant tank 100 that may be utilized by the microprocessor 218 to determine whether the position of the coolant tank 100 is to be moved, rotated, and adjusted to optimize efficiency of the automatic leveling immersion cooling tank system 201, as well as prevent or reduce the likelihood of the coolant 108 spilling from the coolant tank 100 when the lid 250 is not mounted to the coolant tank 100. In this first step 412, the respective sensors 220, 226, 228, 234*a*, 234*b*, 236, 238, 242, 244, 252, 254, 260 collect the data to which they are configured to detect in operation and output one or more sensor signals.

In the first step 412, the respective sensors 220, 226, 228, 234*a*, 234*b*, 236, 238, 242, 244, 252, 254, 260 detect various characteristics of the surface level 112 of the coolant 108, the position of the coolant tank 100, or some other suitable type of quantity, quality, or characteristics with respect to the coolant 108 and the coolant tank 100 that may be utilized by the microprocessor 218 to monitor the position of the coolant tank 100 and monitor the position of the surface level 112 to monitor efficiency of the automatic leveling immersion cooling tank system 201, as well as monitor the likelihood of the coolant 108 spilling from the coolant tank 100 when the lid 250 is not mounted to the coolant tank 100. In this first step 412, the respective sensors 220, 226, 228, 234*a*, 234*b*, 236, 238, 242, 244, 252, 254, 260 collect the data to which they are configured to detect in operation and output one or more sensor signals.

In the second step 414, the one or more sensor signals output by the respective sensors 220, 226, 228, 234*a*, 234*b*, 236, 238, 242, 244, 252, 254, 260 are output to the A/D converter 216. The A/D converter 216 then converts or processes any analog signals as needed. The digital signals and any other signals that pass through the A/D converter 216 are output to the microprocessor 218. Once the microprocessor 218 receives the signals output from the A/D converter 216, the microprocessor further processes these signals and determines whether the position of the coolant tank 100 needs to be moved, rotated, or adjusted to optimize efficiency of the automatic leveling immersion cooling tank system 201, as well as prevent or reduce the likelihood of the coolant 108 spilling from the coolant tank 100 when the lid 250 is not mounted to the coolant tank 100.

In the third step 416, when the microprocessor 218 determines that the coolant tank 100 does not need to be moved, rotated, and adjusted in position, the microprocessor 218 may not output any control signals such that the coolant tank 100 remains in the same position. Alternatively, when the microprocessor 218 determines that the coolant tank 100 does need to be moved, rotated, and adjusted in position, the microprocessor 218 outputs one or more control signals that result in at least one respective motor of the one or more motors 408 being powered to actuate the one or more gimbal structures 406 of the gimbal 401 to move, rotate, and adjust the position of the coolant tank 100 to optimize efficiency of the automatic leveling immersion cooling tank system 201, as well as prevent or reduce the likelihood of the coolant 108 spilling from the coolant tank 100 when the lid 250 is not mounted to the coolant tank 100.

In some embodiments, the first, second, and third steps 306 may be performed continuously such that the automatic leveling immersion coolant tank system 201 continuously in real time moves, rotates, and adjusts the position of the coolant tank 100 to optimize efficiency of the automatic leveling immersion cooling tank system 201, as well as prevent or reduce the likelihood of the coolant 108 spilling from the coolant tank 100 when the lid 250 is not mounted to the coolant tank 100. Alternatively, in some alternative embodiments, the first, second, and third steps 306 may be performed at discrete periods of time selected by a user. For example, each time a selected period of time, which may be selected by a user, passes, the method in the flowchart 300 is performed.

In some embodiments, the microprocessor 218 may check at least one of the following of the surface level 112 of the coolant 108 stored within the coolant tank 100 and the position of the coolant tank with one or more sensors after the first, second, and third steps 412, 414, 416 are performed to confirm that the coolant tank 100 is properly positioned and the one or more electronic components 110 are properly immersed (e.g., partially or fully submerged depending on the depth of the coolant 108 and the desired outcome).

In view of the above discussion, the automatic leveling immersion cooling tank system 400 is an active system that is controlled by the one or more motors 408 similar to the automatic leveling immersion cooling tank system 201.

Figure 15:
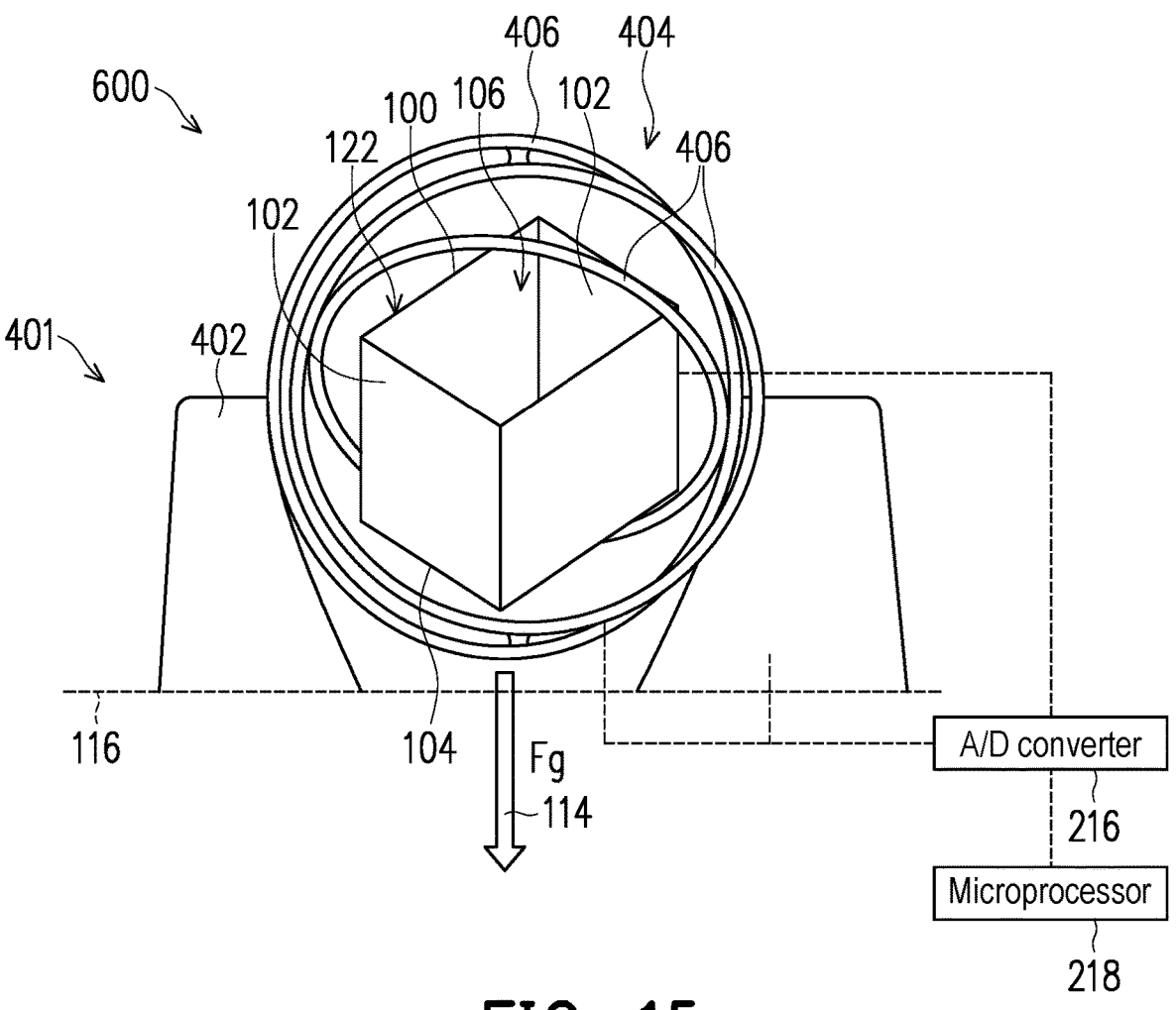
FIG. 15 is a perspective view of an automatic leveling immersion cooling tank system, in accordance with some embodiments.

FIG. 15 is a perspective view of an automatic leveling immersion cooling tank system 500, in accordance with some embodiments. The automatic leveling immersion cooling tank system 500 as shown in FIG. 15 has several of the same or similar features of the automatic leveling immersion cooling tank system 400 as shown in FIG. 13. These same or similar features of the automatic leveling immersion cooling tank system 500 relative to the automatic leveling immersion cooling tank system 400 have been provided with the same or similar reference numerals. For the sake of simplicity and brevity of the present disclosure, the details of these same or similar features will not be redescribed in detail in view of the earlier detailed discussion of these features with respect to FIG. 13.

Unlike the automatic leveling immersion cooling tank system 500, which is an active system, that includes the one or more motors 408 to actively control the one or more gimbal structures 406, the one or more motors 408 are not present in the automatic leveling immersion cooling tank system 600, which is a passive system. Instead, the one or more gimbal structures 406 of the automatic leveling immersion cooling tank system 600 are passively controlled by the force of gravity 114 as the gimbal 401 includes three degrees of freedom about which the one or more gimbal structures 406 may freely rotate. This free rotation of the one or more gimbal structures 406 allows for the coolant tank 100 to be level even when the ground surface 116 is unlevel and the one or more gimbal structures will passively position (e.g., without being controlled by the one or more motors 214*a*, 214*b*, 214*c*, 408) the coolant tank 100 such that the coolant tank 100 is level and the one or more electronic components 110 are properly immersed. Furthermore, when exposed to the vibrations 128, the one or more gimbal structures 406 may passively react and re-position the coolant tank 100 such that the coolant 108 does not spill out of the coolant tank 100. For the passive system of the automatic leveling immersion cooling tank system 600 as shown in FIG. 15, a center of mass of the coolant tank 102 when filled with the coolant 108 and the electronic components 110 (e.g., servers, GPUs, CPUs, or some other suitable electronic component) is lower than a gimbal axis of the gimbal 401.

However, it will be readily appreciated that if large external forces are applied to the one or more gimbal structures 406, the coolant tank 100 may be flipped or drastically placed out of position. To avoid this type of occurrence, while not shown, in some embodiments of the automatic leveling immersion cooling tank system 600 as shown in FIG. 15, if the microprocessor 218 determines that a failure or large external force is occurring, the microprocessor 218 may output a potential failure signal to engage a brake (not shown) that stops operation of the various the automatic leveling immersion cooling tank system 600 to prevent a major spill of the coolant 108 from the coolant tank 100 or to prevent damage to the one or more electronic components 110 within the coolant tank 100.

In this embodiment of the automatic leveling immersion cooling tank system 600 as shown in FIG. 15, the gimbal 401 similarly includes three gimbal structures 406 similar to the embodiment of the automatic immersion cooling tank system 400 as discussed earlier herein. However, in some embodiments, the gimbal 401 may only include a single gimbal structure 406 such that there is only one degree of freedom (e.g., rotatable about only one axis of the x, y, and z axes). In some embodiments, the gimbal 401 may only include a pair of gimbal structures 406 such that there are only two degrees of freedom (e.g., rotatable about only two axes of the x, y, and z axes). In some embodiments, the gimbal 401 may include more than three gimbal structures 406 to provide more precise control of the position of the coolant tank 100.

Figure 16:
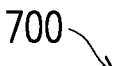
FIG. 16 is a flowchart of a method of adjusting a position of a coolant tank utilizing an automatic leveling immersion cooling tank system, in accordance with some embodiments.
Figure 16:
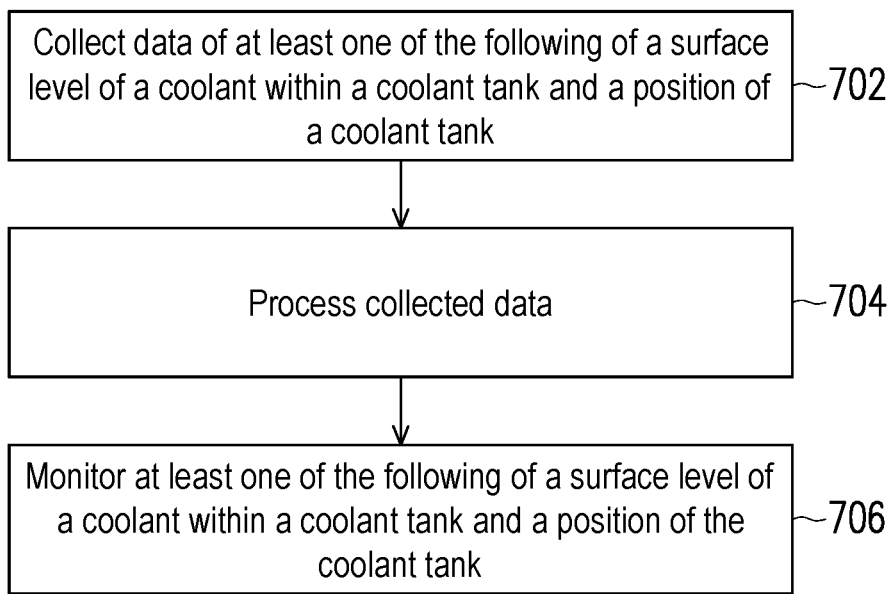

FIG. 16 is a flowchart 700 of a method of adjusting a position of the coolant tank 100 utilizing the automatic leveling immersion cooling tank system 600 as shown in FIG. 15, in accordance with some embodiments. The flowchart 700 of the method of adjusting the position of the coolant tank 100 with the automatic leveling immersion cooling tank system 600 includes a first step 702, a second step 704, and a third step 706.

In the first step 702, the respective sensors 220, 226, 228, 234*a*, 234*b*, 236, 238, 242, 244, 252, 254, 260 detect various characteristics of the surface level 112 of the coolant 108, the position of the coolant tank 100, or some other suitable type of quantity, quality, or characteristics with respect to the coolant 108 and the coolant tank 100. In this first step 702, the respective sensors 220, 226, 228, 234*a*, 234*b*, 236, 238, 242, 244, 252, 254, 260 collect the data to which they are configured to detect in operation and output one or more sensor signals.

In the second step 704, the A/D converter 216 and the microprocessor 218 process the collected data to monitor the position of the coolant tank 100 and monitor the position of the surface level 112 to monitor efficiency of the automatic leveling immersion cooling tank system 201, as well as monitor the likelihood of the coolant 108 spilling from the coolant tank 100 when the lid 250 is not mounted to the coolant tank 100.

In the third step 706, the microprocessor 218 monitors the position of the coolant tank 100 and monitors the surface level 112 of the coolant 108 within the coolant tank 100. The microprocessor monitoring the position of the coolant tank 100 and the surface level 112 of the coolant allows for the microprocessor to determine whether the automatic leveling immersion cooling tank system 600 is functioning at optimized efficiency, as well as monitoring whether there is a high likelihood of the coolant 108 spilling out from the coolant tank 100 when the lid 250 is not mounted to the coolant tank 100. While not shown, in some embodiments of the automatic leveling immersion cooling tank system 600, if the microprocessor 218 determines that a failure is occurring, the microprocessor 218 may send a warning signal to an employee of a semiconductor manufacturing plant (FAB) providing the employee with information as to the potential failure or issue that may be occurring causing the automatic leveling immersion cooling tank system 600 to not function in an optimized fashion.

In view of the above discussion, unlike the actively controlled embodiments of the automatic leveling immersion cooling tank systems 201, 400 as shown in FIGS. 2, 3, and 13 of the present disclosure, the automatic leveling immersion cooling tank system 500 is a passive system that is controlled by the one or more motors 214*a*, 214*b*, 214*c*. In other words, while the one or more motors 214*a*, 214*b*, 214*c* are utilized to control the position of the coolant tank 100, the automatic leveling immersion cooling tank system 500 is simply controlled by passively reacting to the force of gravity, as well as other external forces.

While the automatic leveling immersion cooling tank system 400, which is an active system, and the automatic leveling immersion cooling tank system 600, which is a passive system, are discussed as being mounted to the ground surface 116, in alternative situations, these leveling immersion cooling tank systems 400, 600 may be slightly reoriented to be mounted to a wall surface or a ceiling surface. In other words, the leveling immersion cooling tank systems 400, 600 may be mounted to any surface regardless of that surface having a vertical orientation (e.g., wall surface) or a horizontal orientation (e.g., ground surface or ceiling surface).

Furthermore, it will be readily appreciated that automatic leveling immersion cooling tank systems 201 including any number of the respective sensors or control options as discussed herein may be structured to be mounted to a ground surface, a wall surface, or a ceiling surface. In other words, the embodiments of the present disclosure for the various the automatic leveling immersion cooling tank systems 201, 400, 600 may be mounted to any surface regardless of that surface having a vertical orientation (e.g., wall surface) or a horizontal orientation (e.g., ground surface or ceiling surface).

Figure 17:
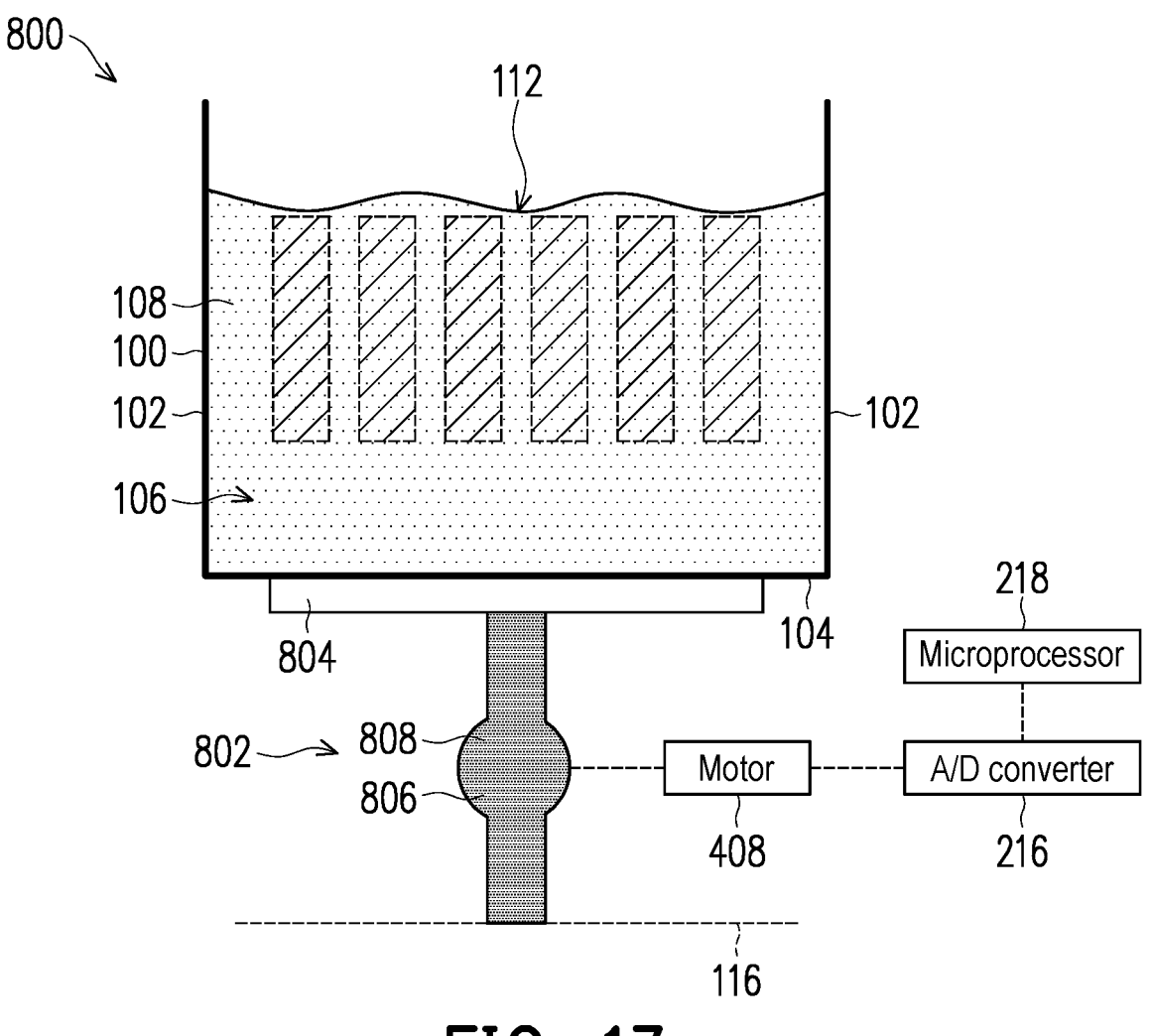
FIG. 17 is a cross-sectional side view of an automatic immersion cooling tank system, in accordance with some embodiments.

FIG. 17 is a cross-sectional view of an automatic leveling immersion cooling tank system 800, in accordance with some embodiments. The automatic leveling immersion cooling tank system 800 includes a gimbal 802 to which the coolant tank 100 is coupled. The gimbal 802 includes one or more mounting structures 804 and a gimbal structure 806.

The coolant tank 100 is mounted to the one or more mounting structures 804. In this embodiment, there is only one mounting structure 804 and the one mounting structure 804 is coupled to an external surface of the bottom end 104 of the coolant tank 100. In some alternative embodiments, the one or more mounting structures 804 may include more than one mounting structure that are coupled at various external surfaces of the coolant tank 100 of the one or more sidewalls 102 and the bottom end 104 of the coolant tank 100.

The gimbal structure 806 is coupled to the one or more mounting structures 804 and is coupled to the ground surface 116. The gimbal structure 806 is in mechanical cooperation with the one or more motors 408, and the one or more motors 408 are in electrical communication either wired or wirelessly with the A/D converter 216. The microprocessor 218 is in electrical communication with the A/D converter either wired or wirelessly. While not shown, selected ones of the respective sensors 220, 226, 228, 234*a*, 234*b*, 236, 238, 242, 244, 252, 254, 260 are present along the coolant tank 100 and are in electrical communication either wired or wirelessly with the microprocessor 218. The gimbal structure 806 includes one or more actuation points2 808 that may be actuated by the one or more motors 408. For example, when the microprocessor 218 determines that the position of the coolant tank 100 needs to be moved, rotated, or adjusted, the one or more motors 408 may be powered on to actuate the one or more actuation points to re-position the coolant tank 100. In this embodiment, there is only one actuation point 808 shown. In some alternative embodiments, there may be more than one actuation point 808 such that the coolant tank 100 may be adjusted in position more swiftly and easily as compared to when there is only one actuation point 808.

The gimbal 802 functions in the same or similar fashion as the gimbal 401. However, while the gimbal 401 is an aerotrim, the gimbal 802 is more similar to a camera gimbal in functionality and form. Accordingly, the functionality of the gimbal 802 is not discussed in detail herein.

In view of the above discussion, the automatic leveling immersion cooling tank system 400 is an active system that is controlled by the one or more motors 408 similar to the automatic leveling immersion cooling tank system 201.

While not shown, in some embodiments of the automatic leveling immersion cooling tank systems 201, 400, 500, 600 of the present disclosure, if the microprocessor 218 determines that a failure is occurring, the microprocessor 218 may send a warning signal to an employee of a semiconductor manufacturing plant (FAB). While not shown, in some embodiments of the automatic leveling immersion cooling tank systems 201, 400, 500, 600 of the present disclosure, if the microprocessor 218 determines that a failure is occurring, the microprocessor 218 may output a potential failure signal to engage a brake (not shown) that stops operation of the various embodiments of the automatic leveling immersion cooling tank systems 201, 400, 500, 600 of the present disclosure.

Figure 18:
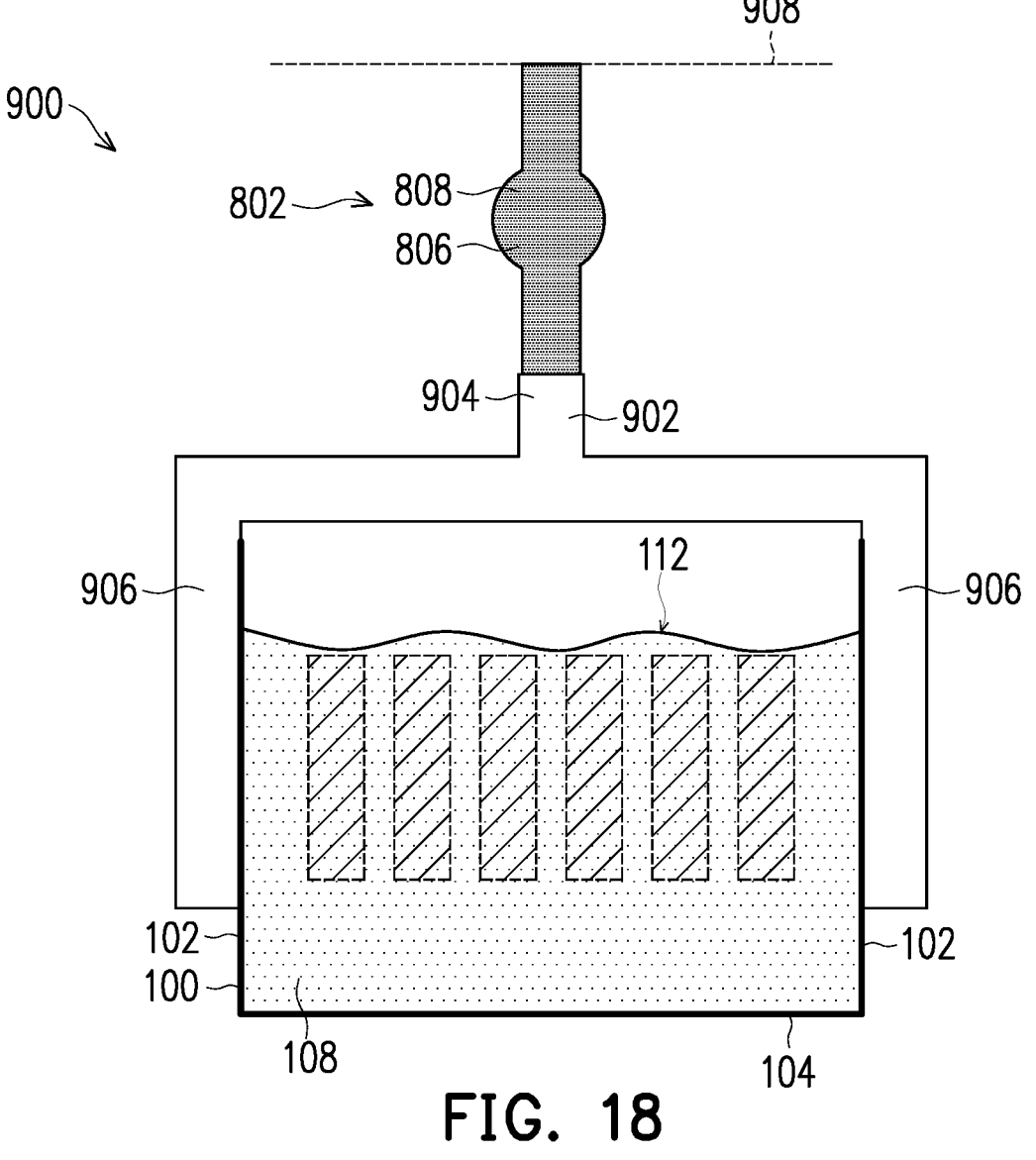
FIG. 18 is a cross-sectional view of an automatic immersion cooling tank system, in accordance with some embodiments.

FIG. 18 is a cross-sectional view of an automatic leveling immersion cooling tank system 900, in accordance with some embodiments. The automatic leveling immersion cooling tank system 900 includes the gimbal 802 to which the coolant tank 100 is coupled. The gimbal 802 includes one or more mounting structures 902 and the gimbal structure 806. The one or more mounting structures 902 are similar to the one or more mounting structures 804 as shown in FIG. 17. However, unlike the one or more mounting structures 804 that are structured to support the coolant tank 100 when the gimbal 802 is mounted to the ground surface 116, the one or more mounting structures 902 have a first portion 904 and one or more second portions 906. The first portion is a straight portion whereas the one or more second portions 906 have an L-like shape as shown in the cross-sectional view as shown in FIG. 18. In other words, the functionality of the automatic leveling immersion cooling tank system 900 is very similar the functionality of the automatic leveling immersion cooling tank system 800 but the automatic leveling immersion cooling stank system 900 is instead structured to be mounted to a ceiling surface 908 instead of the ground surface 116.

While not shown in each and every embodiment of the automatic leveling immersion cooling tank systems 201, 400, 500, 600, 800, 900 of the present disclosure, respective lids may be provided and coupled to the coolant tank 100 to further prevent or reduce the likelihood of the coolant 108 from spilling out of the coolant tank 100.

While not shown, in some embodiments of the automatic leveling immersion cooling tank systems 201, 400, 500, 600, 800, 900 of the present disclosure, respective sensors of one or more sensors of these respective systems 201, 400, 500, 600, 800, 900 include at least one of the following of one or more gyroscopes, one or more acceleration sensors, one or more surface level sensors, one or more magnetometer sensors, one or more laser sensors, one or more optical sensors, one or more level sensors, one or more position sensors, and one or more wave detection sensors. While not shown, the various embodiments of the automatic leveling immersion cooling tank systems 201, 400, 500, 600, 800, 900 of the present disclosure may be restructured or adapted to be mounted to any number of surfaces with various orientations (e.g., a wall surface, a ground surface, a ceiling structure, or some other surface with some other type of orientation).

In view of the above discussion within the present disclosure, the microprocessor 218 may monitor the various characteristics, quantities, and qualities with respect to the coolant tank 100 to control the position of the coolant tank 100 utilizing the various embodiments of the automatic leveling immersion cooling tank systems 201, 400, 600, 800 to improve immersion of the one or more electronic components 110 present within the coolant tank 100, as well as to prevent or reduce the likelihood of spillage of the coolant 108 from the coolant tank 100 when the lid 250 is not present. For example, when the coolant tank 100 is exposed to external forces (e.g., an earthquake, an employee bumping into the coolant tank 100, or some other similar or like type of external force applied to the coolant tank 100) generating the vibration 128, the microprocessor 218 may determine that the position of the coolant tank 100 is to be adjusted to prevent or reduce the likelihood of the coolant 108 spilling out the coolant tank 100 or to maintain proper immersion or submersion of the one or more electronic components 110 within the coolant 108. The microprocessor 218 performs this determination in real time such that the coolant tank 100 remains level resulting in the surface level 112 of the coolant 108 remaining level within the coolant tank 100.

This real time monitoring by the microprocessor 218 preventing or reducing the likelihood of spilling of the coolant 108 from the coolant tank 100 prevents or reduces the likelihood of generating a dangerous work environment within a semiconductor manufacturing plant (FAB). This real time monitoring by the microprocessor 218 preventing or reducing the likelihood of spilling of the coolant 108 from the coolant tank 100 reduces operating costs as the coolant 108 is not wasted due to being spilled out of the coolant tank 100 resulting in the introduction of new coolant into the cooling system 200 to maintain proper heat dissipation efficiency.

At least one embodiment of a system of the present disclosure may be summarized as including a coolant tank including a cavity in which a coolant is stored, the coolant tank being configured to, in operation, receive one or more electrical components to immerse the one or more electrical components within the coolant; one or more sensors configured to, in operation, monitor at least one of the following of a surface level of the coolant and a position of the coolant tank; and one or more actuation structures in mechanical cooperation with the coolant tank, the one or more actuation structures being configured to, in operation, adjust the position of the coolant tank.

At least one embodiment of a method of the present disclosure may be summarized as including detecting at least one of the following of a surface level of a coolant stored within a coolant tank and a position of the coolant tank with one or more sensors; processing one or more sensor signals output by the one or more sensors with a microprocessor to determine a direction of a zenith of gravity relative to the coolant tank; outputting a control signal from the microprocessor based on the direction of the zenith of gravity relative to the coolant tank to adjust the position of the coolant tank with one or more actuation structures; and adjusting the position of the coolant tank in which the coolant is stored with the one or more actuation structures.

At least one embodiment of a system of the present disclosure may be summarized as including a coolant tank configured to, in operation, store a coolant and store one or more electrical components immersed within the coolant; and a gimbal in mechanical cooperation with the coolant tank, the gimbal including one or more degrees of freedom, the gimbal is configured to, in operation, passively adjust a position of the coolant tank relative to a surface on which the gimbal rests.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a coolant tank including a cavity in which a coolant is stored, the coolant tank being configured to, in operation, receive one or more electrical components to immerse the one or more electrical components within the coolant;
one or more sensors configured to, in operation, monitor at least one of a surface level of the coolant or a position of the coolant tank; and
one or more actuation structures in mechanical cooperation with the coolant tank the one or more actuation structures being configured to, in operation, adjust the position of the coolant tank;
a microprocessor coupled to the one or more sensors, the microprocessor configured to, in operation, collect data from the one or more sensors to determine whether to adjust a the position of the coolant tank;

wherein each respective actuation structure of the one or more actuation structures is configured to, in operation, adjust the position of the coolant tank in response to control signals output by the microprocessor;
wherein each respective actuation structure of the one or more actuation structures are linear actuators, and each respective actuation structure of the one or more actuation structures includes a motor in mechanical cooperation with a piston.

2. The system of claim 1, wherein the one or more sensors are at least one of one or more gyroscopes, one or more acceleration sensors, one or more surface level sensors, one or more magnetometer sensors, one or more laser sensors, one or more optical sensors, one or more level sensors, one or more position sensors, or one or more wave detection sensors.

3. A system, comprising:
a coolant tank configured to, in operation, store a coolant and store one or more electrical components within the coolant; and
a gimbal in mechanical cooperation with the coolant tank, the gimbal including one or more degrees of freedom, the gimbal is configured to, in operation, passively adjust a position of the coolant tank relative to a surface on which the gimbal rests.

4. The system of claim 3, wherein the one or more degrees of freedom of the gimbal includes at least one axis of free rotation configured to, in operation, passively adjust the position of the coolant tank based on one or more external forces on the coolant tank.

5. The system of claim 3, wherein the one or more degrees of freedom of the gimbal includes a first axis of free rotation and a second axis of free rotation configured to, in operation, passively adjust the position of the coolant tank based on one or more external forces on the coolant tank, and the first axis of free rotation is transverse to the second axis of free rotation.

6. The system of claim 3, wherein the one or more degrees of freedom of the gimbal includes a first axis of free rotation, a second axis of free rotation, and a third axis of free rotation configured to, in operation, passively adjust the position of the coolant tank based on one or more external forces on the coolant tank, and the first axis of free rotation is transverse to the second axis of rotation and the third axis of free rotation, the second axis of free rotation is transverse to the first axis of free rotation and the third axis of free rotation, and the third axis of free rotation is transverse to the first axis of free rotation and the second axis of free rotation.

7. The system of claim 3, further comprising:
one or more sensors configured to, in operation, monitor at least one of a surface level of the coolant stored within the coolant tank or the position of the coolant tank; and
a microprocessor in electrical communication with the one or more sensors configured to, in operation, collect and processor signals output by the one or more sensors.

8. A system, comprising:
a gimbal including:
a base; and
a gyroscope frame coupled to the base;
a coolant tank coupled to the gyroscope frame, the cooling tank is suspended from a ground surface by the gyroscope frame and the base of the gimbal, the coolant tank including a cavity in which a coolant is stored, the coolant tank being configured to, in operation, receive one or more electrical components to immerse the one or more electrical components within the coolant;

one or more sensors configured to, in operation, monitor at least one of a surface level of the coolant or a position of the coolant tank; and wherein the gimbal is configured to, in operation, adjust the position of the coolant tank.

9. The system of claim 8, wherein the base is mounted to a ground surface.

10. The system of claim 8, wherein the base is mounted to a ceiling surface.

11. The system of claim 8, wherein the gimbal includes at least three degrees of rotation about at least three different axes.

12. The system of claim 8, further comprising a motor in mechanical cooperation with the gyroscope frame.

13. The system of claim 12, further comprising an A/D converter in electrical communication with the motor.

14. The system of claim 13, further comprising a microprocessor in electrical communication with the A/D converter.

15. The system of claim 1, wherein the coolant tank further includes a coolant reservoir and a lid, and the lid is configured to, in operation, be placed over an opening in the coolant reservoir to seal the coolant tank.

16. The system of claim 15, wherein the one or more sensors includes at least one sensor on the lid.

17. The system of claim 16, wherein the at least one sensor on the lid is a wave sensor.

18. The system of claim 15, wherein the one or more sensors includes at least one sensor in the coolant reservoir.

19. The system of claim 18, the at least one sensor in the coolant reservoir is a wave sensor.

20. The system of claim 15, wherein the one or more sensors includes:

a first sensor on the lid; and a second sensor in the coolant reservoir.

* * * * *